United States Patent
Shimbayashi et al.

(10) Patent No.: US 6,917,541 B2
(45) Date of Patent: Jul. 12, 2005

(54) NONVOLATILE SEMICONDUCTOR MEMORY DEVICE

(75) Inventors: Koji Shimbayashi, Kasugai (JP);
Takaaki Furuyama, Kasugai (JP)

(73) Assignee: Fujitsu Limited, Kawasaki (JP)

(*) Notice: Subject to any disclaimer, the term of this patent is extended or adjusted under 35 U.S.C. 154(b) by 490 days.

(21) Appl. No.: 10/060,185

(22) Filed: Feb. 1, 2002

(65) Prior Publication Data

US 2003/0043623 A1 Mar. 6, 2003

(30) Foreign Application Priority Data

Aug. 31, 2001 (JP) ........................................ 2001-262882

(51) Int. Cl.[7] .............................................. G11C 16/04
(52) U.S. Cl. .............................. 365/185.05; 365/185.11; 365/185.21
(58) Field of Search ........................ 365/185.05, 185.11, 365/185.21, 185.01, 185.33, 63

(56) References Cited

U.S. PATENT DOCUMENTS

| | | | | |
|---|---|---|---|---|
| 6,091,662 A | * | 7/2000 | Mochida | ..................... 365/233 |
| 6,101,122 A | * | 8/2000 | Hirota | ..................... 365/185.05 |
| 6,359,805 B1 | * | 3/2002 | Hidaka | ..................... 365/171 |
| 6,515,906 B2 | * | 2/2003 | Tedrow et al. | ......... 365/185.21 |
| 2003/0039142 A1 | * | 2/2003 | Tsao et al. | ............. 365/185.12 |
| 2003/0107912 A1 | * | 6/2003 | Derner et al. | ................ 365/149 |

* cited by examiner

Primary Examiner—Van Thu Nguyen
Assistant Examiner—Dang Nguyen
(74) Attorney, Agent, or Firm—Arent Fox PLLC

(57) ABSTRACT

This invention provides a nonvolatile semiconductor memory device including a novel memory core portion in which an influence of a parasitic element component in a memory cell information reading path is excluded in a reading operation, and novel sensing means accompanying this memory core structure, so as to achieve rapid sensing. In the memory core portion, a selected memory cell is selected by a global bit line through a local bit line and an adjacent global bit line is connected to a local bit line in a non-selected sector. A column selecting portion connects a pair of the global bit lines to a pair of data bus lines. A load portion having a load equivalent to a parasitic capacitance of a path leading from the memory cell and for supplying a reference current to a reference side is connected to a pair of the data bus lines. A current of the memory cell information is compared with the reference current by a current comparing portion and a differential current is outputted. A path load is equalized by a pair of adjacent paths so that an effect from noise is canceled, thus making it possible to achieve rapid reading.

47 Claims, 25 Drawing Sheets

ENTIRE BLOCK DIAGRAM OF A NONVOLATILE SEMICONDUCTOR MEMORY DEVICE ACCORDING TO A FIRST EMBODIMENT

ENTIRE BLOCK DIAGRAM OF A NONVOLATILE SEMICONDUCTOR MEMORY DEVICE ACCORDING TO A FIRST EMBODIMENT

CIRCUIT DIAGRAM SHOWING A THEORETICAL BLOCK DIAGRAM OF A MEMORY CORE PORTION OF THE FIRST EMBODIMENT

CIRCUIT DIAGRAM SHOWING A FIRST EXAMPLE OF THE MEMORY CORE PORTION

CIRCUIT DIAGRAM SHOWING A SECOND EXAMPLE OF THE MEMORY CORE PORTION

CIRCUIT DIAGRAM SHOWING REDUNDANT STRUCTURES OF THE FIRST AND SECOND EXAMPLES OF THE MEMORY CORE PORTION

FIG.7 CIRCUIT DIAGRAM SHOWING A FIRST EXAMPLE OF THE COLUMN SELECTING PORTION

CIRCUIT DIAGRAM SHOWING A SECOND THEORETICAL BLOCK DIAGRAM OF THE COLUMN SELECTING PORTION OF THE FIRST EMBODIMENT

FIG.9 CIRCUIT DIAGRM SHOWING A SECOND EXAMPLE OF THE COLUMN SELECTING PORTION

CIRCUIT DIAGRAM SHOWING THE FIRST THEORETICAL BLOCK DIAGRAM OF A LOADING PORTION OF THE FIRST EMBODIMENT

FIG.11
CIRCUIT DIAGRAM SHOWING A FIRST EXAMPLE OF THE LOADING PORTION
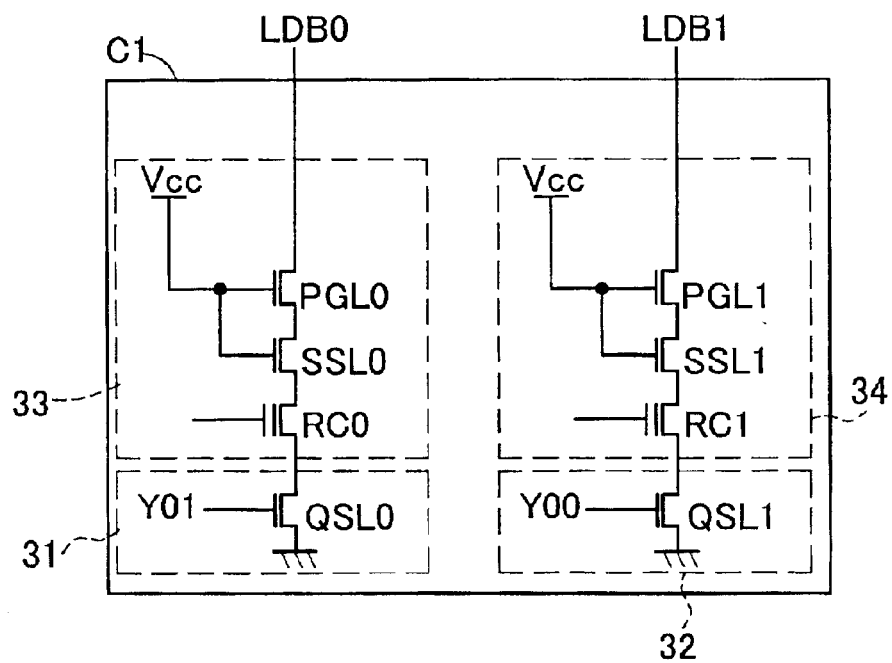
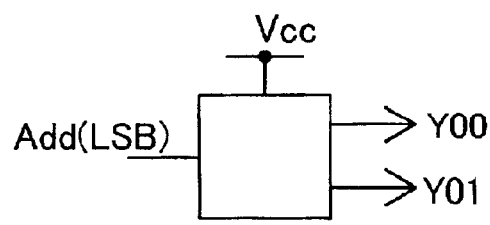

CIRCUIT DIAGRAM SHOWING A SECOND THEORETICAL BLOCK
DIAGRAM OF A LOADING PORTION OF THE FIRST EMBODIMENT

FIG.13 CIRCUIT DIAGRAM SHOWING A SECOND EXAMPLE OF THE LOADING PORTION

FIG.14 CIRCUIT DIAGRAM SHOWING A THIRD EXAMPLE OF THE LOADING PORTION

CIRCUIT DIAGRAM SHOWING A THEORETICAL BLOCK DIAGRAM OF A CURRENT COMPARING PORTION OF THE FIRST EMBODIMENT

CIRCUIT DIAGRAM SHOWING A FIRST EXAMPLE OF THE CURRENT COMPARING PORTION

CIRCUIT DIAGRAM SHOWING A SECOND EXAMPLE OF THE CURRENT COMPARING PORTION

FIG.18 OPERATING WAVEFORM DIAGRAM SHOWING A READ OPERATION OF THE FIRST EMBODIMENT

CIRCUIT DIAGRAM SHOWING A MEMORY CORE PORTION OF A SECOND EMBODIMENT

CIRCUIT DIAGRAM SHOWING A MEMORY CORE PORTION OF A THIRD EMBODIMENT

CIRCUIT DIAGRAM SHOWING A MEMORY CORE PORTION OF A FOURTH EMBODIMENT

ENTIRE BLOCK DIAGRAM OF A CONVENTIONAL NONVOLATILE SEMICONDUCTOR MEMORY DEVICE

CIRCUIT DIAGRAM SHOWING A CONVENTIONAL MEMORY CORE PORTION

CIRCUIT DIAGRAM SHOWING A CONVENTIONAL COLUMN SELECTING PORTION

CIRCUIT DIAGRAM SHOWING A CONVENTIONAL COMPARING PORTION

US 6,917,541 B2

NONVOLATILE SEMICONDUCTOR MEMORY DEVICE

BACKGROUND OF THE INVENTION

1. Field of the Invention

The present invention relates to an operation for reading memory cell information in a nonvolatile semiconductor memory device, and more particularly to high-speed sensing technology for the reading operation.

2. Description of the Related Art

In a nonvolatile semiconductor memory device such as a flash memory, storage of memory cell information is carried out by current driving power of a nonvolatile transistor in the nonvolatile memory cell. That is, the storage of the memory cell information is carried out according to a difference such as whether or not the nonvolatile transistor allows a current to flow with respect to memory cell information of "1"/"0" or whether it supplies a larger amount of current or a smaller amount of current.

Then, sensing of the memory cell information stored in the nonvolatile semiconductor memory device is carried out depending on whether or not a current flows through a digit line connected to a selected memory cell, or the size relationship between the flowing current and a reference current flowing to a reference cell.

FIG. 22 shows an entire block diagram of a nonvolatile semiconductor memory device of a conventional art. Memory cells MC are disposed in a matrix form so as to form a memory core portion A100. The memory cells are grouped by a predetermined quantity as a basic unit so that sector SEC100m and SEC100n are formed. By decoding an address signal Add by means of a decoder 101 when reading memory cell information, a word line WL belonging to a selected sector is activated and then, the memory cell MC is connected to a global bit line GBL, so that appropriate memory cell information appears in the global bit line GBL.

In the memory core portion A100 (FIG. 23), bit lines LBL00 through LBL03 and LBL10 through LBL13 of each sector are disposed independently because of necessity of separate operations of the sector SEC100 and sector SEC101. That is, there is a hierarchical structure composed of global bit lines GBL0 and GBL1 passing through the sectors and the two local bit lines LBL00 through LBL03 and LBL10 through LBL13 connected to the global bit line through a sector switch. A plurality of the memory cells MC disposed in a sector are connected to each local bit line. FIG. 23 exemplifies memory cell groups MC00 through MC03 selected by a word line WL0 in the sector SEC100 and memory cell groups MC100 through MC13 selected by a word line WL1 in the sector SEC101.

When reading memory cell information, any one sector is selected so that an appropriate word line (WL0 or WL1) is activated. Consequently, all the local bit lines LBL00 through LBL03 in the selector or LBL10 through LBL13 in the sector are connected to the respective memory cells MC00 through MC03 or MC10 through MC13, so that memory cell information appears. Then, any one of two sector switches connected to the global bit lines GBL0, GBL1 is selected and the respective global bit lines GBL0, GBL1 are connected to the memory cells MC00 through MC03 or MC10 through MC13 through a sector switch. Upon reading memory cell information, all the global bit lines GBL (FIG. 22) possess selected memory cell information. Meanwhile, redundant configurations SP100, SP101 of the memory core portion A100 are constructed with the global bit line SGBL as a basic unit.

Returning to FIG. 22, every predetermined number of the global bit lines GBL connected to the memory cells MC is inputted to a column selecting portion B100 and any one is selected from them and connected to a data bus LDB. FIG. 24 shows an example of a circuit in which one is selected from 32 global bit lines GBL0 through GBL31 and connected to the data bus line LDB. One signal of decoding signals YD00 through YD1F is activated according to an address signal Add. Consequently, only a path gate transistor connected to an activated decoding signal turns on, so that an appropriate global bit line is connected to a data bus line LDBn and memory cell information appears in the data bus LDB.

The memory cell information appearing in the data bus line LDB is detected by comparing a current flowing from the data bus line LDB to the memory cell MC depending on current driving performance of the memory cell MC as described above with a reference current. More specifically, after current is converted to voltage, this comparison is carried out by a differential amplifier 106. Cascode portions 104, 105 execute current/voltage conversion. FIG. 25 shows an example of a concrete circuit. When a current flowing to the data bus line LDB and the reference current flow through NMOS transistors QN102, QN202, input voltage to the differential amplifier 106 is adjusted depending on current.

Here, the data bus line LDB is constructed with multiple bits such as 8 bits, 16 bits and the above-described reading structure is provided on each data bus line LDB. That is, as for the cascode circuit 104 and the differential amplifier 106, 8 sets thereof are provided for 8-bit configuration and 16 sets are provided for 16-bit configuration. Circuits corresponding to a constructed multiple bit configuration are necessary. Meanwhile, there is a reference cell RC100 and there is also a cascode portion 105 on the reference current side corresponding to the reference cell. This output is connected to respective differential amplifiers in common. Therefore, parasitic capacitance between input signal lines on memory cell information side and reference side in each differential amplifier 106 is unbalanced. To adjust this, generally, a capacitance load CLD2 is applied to an input signal line on the memory cell information side.

Further, the reference cell RC100 is provided in a different dedicated region from a sector region in the memory core portion A100 in order to avoid influences of a programming operation to the memory cell MC and voltage stress by an erase operation. Thus, a reference bus line RB to which the reference cell RC100 in a dedicated region is connected is not connected to other memory cells on a path but connected directly to the cascode portion 105. On the other hand, a plurality of non-selected memory cells are connected to the local bit line to which the memory cell MC is connected, so as to be connected to the global bit line GBL through the sector switch, thereby constructing a hierarchical structure. Therefore, in a path leading from the memory cell MC to the cascode portion 104, there exist a junction capacitance of a transistor in a non-selected memory cell MC, a parasitic capacitance such as an interline capacitance between the local bit line and global bit line and another bit line and word line disposed adjacent to or on an upper/lower layer or other signal line or the like and a parasitic resistance due to a sector switch or the like. To adjust an unbalanced condition of the parasitic element, generally, a capacitance load CLD1 is added to a path leading from the reference cell RC100 to the cascode portion 105. Although FIG. 22 shows a case where the reference cell RC100 is disposed within the memory core portion A100, the present invention is not restricted to this example, such that it may be disposed outside of the memory core portion A100.

By adjusting the parasitic element component with the capacitance loads CLD1, CLD2, transient response characteristics on the memory cell information side and reference side are equalized so as to enable sensing in a transient state without waiting for a signal propagation delay due to the parasitic element, thereby reducing sensing time.

The data bus line LDB is used for writing memory cell information (hereinafter referred to as a program). That is, input data IDAT amplified by a write amplifier 103 is outputted to the data bus line LDB. By selecting an appropriate global bit line GBL by means of column selecting means B100, program action is executed in the memory cell MC by the global bit line GBL through the local bit line.

In a conventional nonvolatile semiconductor memory device 100, a parasitic capacitance in a current path on the memory cell information side leading from the memory cell MC to the cascode portion 104 is matched artificially by adding the capacitance load CLD1 to the current path on the reference cell side.

However, the parasitic capacitance on the memory cell information side varies with a distribution having a certain width because of a tolerable variation in the manufacturing process. That is, an interval between adjoining lines varies due to a variation in the etching processing of each line and interline capacitance between the adjoining lines varies over a certain width. Further, due to variation of the thickness of a layer insulating film, a gap between lines of the upper and lower layers varies, so that the interline capacitance between the adjoining lines varies over a certain width. Further, the junction capacitance and on resistance also vary over each a certain width due to variation in various kinds of parameters of the transistor such as gate oxide film, concentration and depth of diffused layer and the like.

Accompanied by an increased capacity of the nonvolatile semiconductor memory device and an increased size of its chip die, a difference of the parasitic capacitance in a chip face tends to increase even within the same chip. The diameter of the wafer has been increased at the same time, and thus there is a fear that the difference in the wafer face may also increase.

That is, a surrounding environment in which bit lines are disposed and physical parameters of a formed path are different between a current path leading from a memory cell MC disposed in a sector through a bit line having a hierarchical structure and a reference current path directly connected from a reference cell disposed in its dedicated region. Thus, even if the capacitance loads CLD1, CLD2 including the characteristics of both the parasitic element components are applied at the design stage, it is difficult to match the characteristic of the reference side with the characteristic of the parasitic element component, including these variable factors, because manufacturing variation and trend of difference in chip or wafer face distribution are different from one and another.

Therefore, in a transient stage during a reading operation, accompanying a propagation delay of a signal due to the parasitic element component, potential changes in current paths on the memory cell information side and the reference side will not match. Therefore, in order to detect memory cell information, it is necessary to wait until a potential change converges in a specified range, thereby obstructing a reading operation from being carried out rapidly, which is a problem which should be solved.

SUMMARY OF THE INVENTION

The present invention has been achieved to solve the above-described problems of the conventional technology, and it is an object of the present invention is to provide a nonvolatile semiconductor memory device comprising a novel memory core portion in which an influence of a parasitic element component on a reading path of memory cell information is excluded and novel sensing means accompanying this structure in order to achieve rapid sensing in a reading operation.

To achieve the above object, according to one aspect of the present invention, there is provided a nonvolatile semiconductor memory device including a plurality of digit lines to which a plurality of nonvolatile memory cells are connected, wherein upon reading of memory cell information, the digit lines contain a first digit line connected to a selected one of the nonvolatile memory cells; and a second digit line connected to only non-selected one of the nonvolatile memory cells, while the memory cell information is read out with the first and second digit lines as a pair.

In the above described nonvolatile semiconductor memory device, upon reading memory cell information, the memory cell information is read out with the first digit line to which the nonvolatile memory cell is connected and the second digit line to which only non-selected nonvolatile memory cells are connected as a pair.

Consequently, the first digit line for transmitting memory cell information acts as a cell information side while the second digit line acts as a reference side and the memory cell information is read out with the first and second digit lines as a pair. Thus, a path of the second digit line having an equivalent path configuration to the path of the first digit line which is a reading path can be set to a load on the reference side. The loads existing on the path due to the parasitic capacitance can be equalized ideally on the cell information side and on the reference side.

Because the reference side has an equivalent path configuration to a cell information propagation path on the cell information side, both the paths on the cell information side and reference side always have equivalent loads due to the parasitic capacitance, regardless of manufacturing variation and variation in chip or wafer surface, so that upon reading, equivalent transient response characteristics can be obtained stably. Therefore, by sensing at a transient response time without waiting for a balanced condition of path potential between the cell information side and reference side, the memory cell information can be read out rapidly and stably.

To achieve the above object, according to another aspect of the present invention, there is provided a nonvolatile semiconductor memory device having a plurality of local digit lines to which a plurality of nonvolatile memory cells are connected and a global digit line provided for each predetermined number of the local digit lines and to which the local digit line is selectively connected, wherein upon reading memory cell information, the global digit lines comprise: a first global digit line connected to a first local digit line to which the selected nonvolatile memory cell is connected; and a second global digit line adjacent the first global digit line, to which the selected nonvolatile memory cell is not connected, while the memory cell information is read out with the first and second global digit lines as a pair. At this time, only non-selected nonvolatile memory cells may be connected to the second global digit line.

In the nonvolatile semiconductor memory device, upon reading memory cell information, with the first global digit line to which the selected nonvolatile memory cell is connected and with the second global digit line connected to the second local digit line as a pair, the memory cell information is read out through the first local digit line. In this case, the first and second global digit lines disposed adjacent each other make a pair. Only non-selected nonvolatile memory cells are connected to the second global digit line.

As a result, with the first and second global digit lines as a pair while the first global digit line for carrying the memory cell information and the second global digit line serves as cell information side and reference side, respectively, the memory cell information is read out. Thus, a path from the second local digit line to the second global digit line, having the same path configuration as a path from the first local digit line to the first global digit line, which is a reading path, can be loaded with a load on the reference side. The loads due to the parasitic capacitance existing on a path can be equalized ideally between the cell information side and the reference side.

Because the first global digit line and the second global digit line are disposed adjacent each other, noise applied to a global digit line is transmitted to the other global digit line, so that there is equivalent noise between the first and second global digit lines. That is, noise of the same phase is applied between the first and second global digit lines. By disposing the first and second global digit lines adjacent each other, effects of the noise can be canceled by each other in the reading operation with both the global digit lines as a pair.

Because the reference side has the same path configuration as the cell information propagating path on the cell information side and the both paths are disposed adjacent each other, the paths on the cell information side and reference side always have the same loads due to the parasitic capacitance irrespective of manufacturing variation or variation in chip or wafer face. Consequently, equivalent transient response characteristics can be obtained stably upon reading. Therefore, by sensing at a transient response time without waiting for a balanced condition of path potential between the cell information side and reference side, the memory cell information can be read out stably and rapidly. Further, because noise of the same phase is applied between both the paths, noises are canceled by each other so that reading reliability of the memory cell information is improved.

According to a third aspect of the present invention, there is provided a nonvolatile semiconductor memory device including a plurality of digit lines to which a plurality of nonvolatile memory cells are connected, wherein the digit lines include a first digit line to which a selected one of the nonvolatile memory cells is connected; and a second digit line to which only non-selected nonvolatile memory cells are connected, the nonvolatile semiconductor memory device further comprising a selecting portion provided for every predetermined number of the digit lines and for, upon reading memory cell information, selecting both the first and second digit lines and, upon writing memory cell information, selecting only the first digit line.

In the nonvolatile semiconductor memory device, upon reading memory cell information, the selecting portion selects the first digit line to which the selected nonvolatile memory cell is connected and the second digit line to which only the non-selected nonvolatile memory cells are connected from a predetermined number of the digit lines. Upon writing the memory cell information, only the first digit line is selected.

As a result, when appropriate first and second digit lines are selected from the predetermined number of the digit lines, the selecting portion needs to decode address signals or the like. Because upon reading, both the first and second digit lines are selected, a decoding hierarchy can be set up that is shallower than that for writing, so that the selecting portion for reading can be made compact.

According to a fourth aspect of the present invention, there is provided a nonvolatile semiconductor memory device having a plurality of digit lines to which a plurality of nonvolatile memory cells are connected and a data line connected selectively to the digit line, the nonvolatile semiconductor memory device further comprising: a first data line to which the selected nonvolatile memory cells are connected through a first digit line; a second data line to which only the non-selected nonvolatile memory cells are connected through a second digit line; a first loading portion connected to the first data line; and a second loading portion having a structure equivalent to that of the first loading portion, connected to the second data line and for supplying a reference current to a current flowing through the first data line based on the memory cell information, the first loading portion having a load equivalent to a load existing on a path from the nonvolatile memory cell to the second loading portion, the second loading portion having a load equivalent to a load existing on a path from the nonvolatile memory cell to the first loading portion, wherein the memory cell information is read out with the first and second data lines as a pair.

In the nonvolatile semiconductor memory device, the selected nonvolatile memory cell is connected to the first data line through the first digit line, and the second digit line to which only the non-selected nonvolatile memory cells are connected is connected to the second data line. The memory cell information is read out with both the data lines as a pair. The first and second loading portions are connected to the first and second data lines, respectively. The second loading portion is provided with a load equivalent to a load existing in a path leading from the nonvolatile memory cell to the first loading portion. The first loading portion is provided with a load equivalent to a load existing in a path leading from the nonvolatile memory cell to the second loading portion. Further, upon reading memory cell information, a reference current with respect to a flow flowing through the first data line flows based on the memory cell information.

Consequently, with respect to a flow flowing through the first data line via the first digit line based on the memory cell information of the selected nonvolatile memory cell, the reference current flows to the second loading portion. The loads applied to the first and second loading portions are loads equivalent to a load existing in a path leading from the nonvolatile memory cell to the second and first loading portions. The first and second data lines including the first and second loading portions have equivalent structures as current paths for a current based on the memory cell information and the reference current. Consequently, the reading operation with the first and second data lines as a pair can be securely carried out irrespective of the manufacturing variation and a variation in a chip or wafer face.

According to a fifth aspect of the present invention, there is provided a nonvolatile semiconductor memory device having a plurality of digit lines to which a plurality of nonvolatile memory cells are connected and a data line connected selectively to the digit line, the nonvolatile semiconductor memory device further comprising: a first data line to which the selected nonvolatile memory cell is connected through a digit line and through which a current based on memory cell information flows; a second data line through which a reference current flows; and a current comparing portion to which the first and second data lines are connected and which compares a current based on the memory cell information with the reference current, wherein the current comparing portion includes a current load portion having a current mirror structure and a connection changing portion for changing a connection between the first and second data lines and the current load portion.

In the nonvolatile semiconductor memory device, connecting of the first data line, in which a current based on memory cell information flows, and the second data line, in which the reference current flows, to a current mirror structure in the current load portion of the current comparing portion is carried out through the connection changing portion which changes connection appropriately.

According to a sixth aspect of the present invention, there is provided a nonvolatile semiconductor memory device wherein the first and second data lines are connected to the current comparing portion, the current comparing portion including a current load portion for supplying a current equivalent to the reference current to the first and second data lines.

In the nonvolatile semiconductor memory device, a current equivalent to the reference current is supplied from the current load portion to the first and second data lines connected to the current comparing portion.

Consequently, the memory cell information can be read out based on a differential current between the current based on the memory cell information and the reference current supplied from the current load portion.

The above and further objects and novel features of the invention will more fully appear from following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 11 is a circuit diagram showing a first example of the loading portion;

DETAILED DESCRIPTION OF THE PREFERRED EMBODIMENTS

Hereinafter, the first through fourth embodiments of the nonvolatile semiconductor memory device of the present invention will be described in detail with reference to FIGS. 1 through 21.

Figure 1:
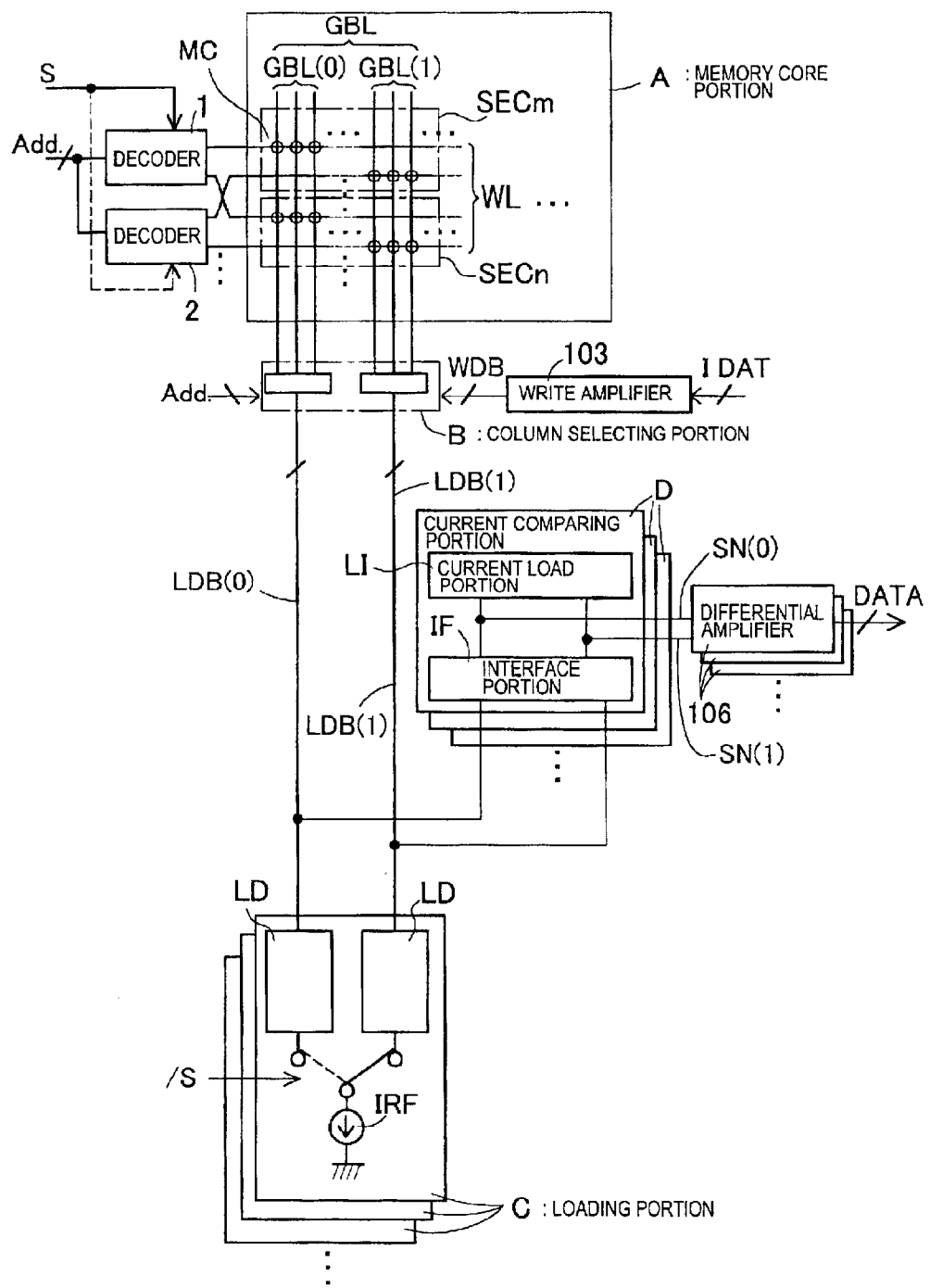
FIG. 1 is a block diagram showing an entire block diagram of a nonvolatile semiconductor memory device according to a first embodiment of the present invention.
Figure 22:
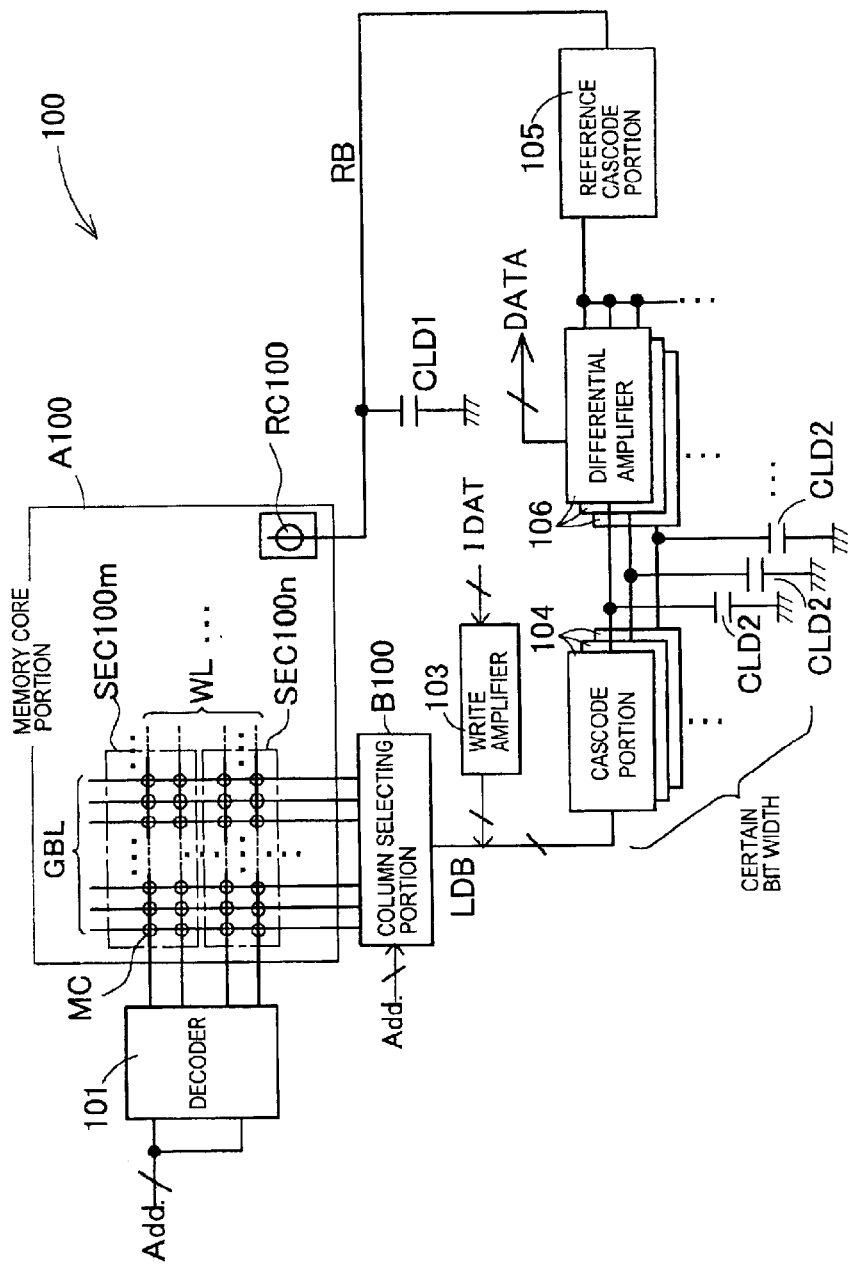
FIG. 22 is a block diagram showing an entire block diagram of a conventional nonvolatile semiconductor memory device.
Figure 23:
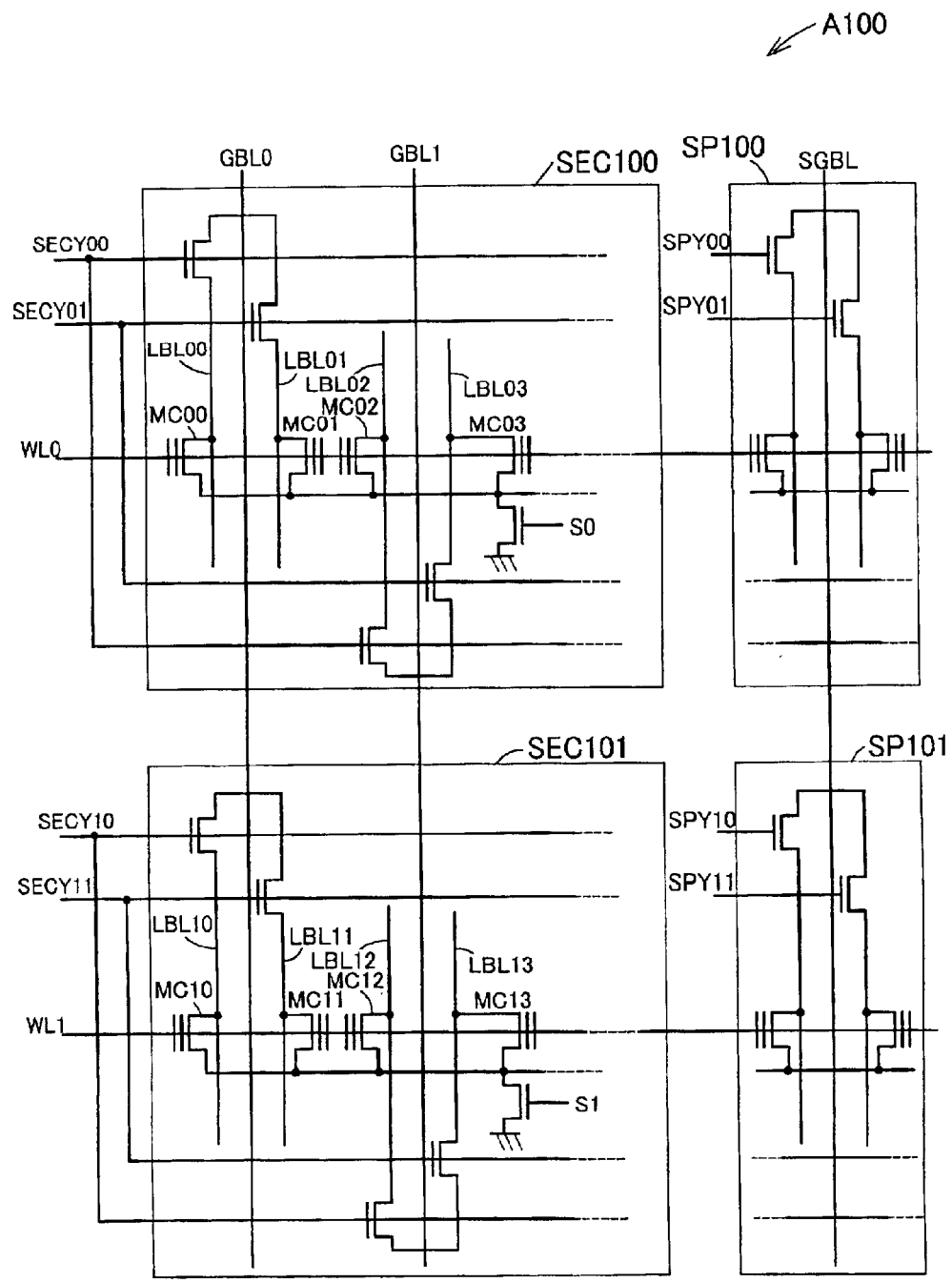
FIG. 23 is a circuit diagram showing a conventional memory core portion.

First, FIG. 1 shows an entire structure of the nonvolatile semiconductor memory device of the first embodiment. Referring to the entire block diagram of FIG. 1, a memory core portion A and a column selecting portion B are provided instead of the memory core portion A100 and the column selecting portion B100 in a conventional nonvolatile semiconductor memory device shown in FIG. 22. Because the selecting method of the global bit line GBL in the memory core portion A is different from the memory core portion A100, as the word line WL selecting decoder, decoders 1, 2 are provided instead of the decoder 101. Further, instead of the reference bus line RB dedicated for reference and the data bus line LDB commonly used for reading and programming, as data bus line for reading, data bus lines LDB(0), LDB(1) are provided as a pair. Additionally, a program data bus line WDB is provided. Accompanied by a change in data bus line configuration at the time of read-out, a loading portion C and a current comparing portion D are provided instead of cascode portions 104, 105 and capacitance loads CLD1, CLD2 for adjustment of parasitic capacitance. Here, because the data buses LDB(0), LDB(1) have multi-bit configuration such as 8 bits or 16 bits and the like, the loading portion C and the current comparing portion D are provided each with a number corresponding to that bit width.

The memory core portion A of FIG. 1 shows schematically a condition in which memory cells MC selected by the word lines WL are connected to the global bit lines GBL. A predetermined number of the memory cells MC are allocated in each of sectors SECm and SECn. Respective predetermined groups in the sector are selectively connected to the global bit lines GBL. That is, the decoder 1 activates the word line WL so as to select a memory cell MC group to be connected to global bit lines GBL(0) in the global bit lines GBL in the respective sectors SECm, SECn according to a predetermined control signal S. Further, the decoder 2 activates the word line WL so as to select a memory cell MC group to be connected to a global bit lines GBL(1) according to a predetermined control signal S. The global bit lines GBL(0), GBL(1) are global bit line groups in which the global bit lines GBL are divided and grouped every predetermined number. The predetermined control signal S is a control signal for selecting a group in the global bit lines GBL(0), GBL(1) connected to the memory cells MC and this signal is generated according to a dedicated control signal or part of address signals or address signals. The decoders 1, 2 decode the address signals Add to select any one word line WL, so that the memory cells MC are connected to any group in the global bit lines GBL(0), GBL(1).

A column selecting portion B is a portion for connecting the global bit lines GBL(0), GBL(1) to the data bus lines LDB(0), (1) upon reading. Of the global bit lines to which a selected memory cells MC are connected (GBL(0) or GBL(1)), a global bit line, to which a memory cell MC which should be read out is connected, is selected and connected to the data bus line (LDB(0) or LDB(1)). The other data bus line LDB(1) or LDB(0) is connected to a global bit line GBL(1) or GBL(0) to which the selected memory cell MC is not connected. Such selected data bus lines LDB(0), LDB(1) are read out as a pair. The connection is carried out as follows. According to a decode signal generated from the address signals Add, a switch portion between the global bit lines GBL(0), GBL(1) and data bus lines LDB(0), LDB(1) is controlled so as to be turned on/off.

On the other hand, upon programming, the global bit lines GBL(0), GBL(1) are connected to the program data bus lines WDB. Of the global bit lines GBL(0), GBL(1) to which the selected memory cells MC are connected, a global bit line, to which a memory cell MC which should be programmed is connected, is selected and connected to the data bus line LDB(0) or LDB(1).

The loading portion C connects loads LD to the data bus lines LDB(0), LDB(1) and a reference power supply IRF is connected to the data bus line LDB(1) or LDB(0) to which the selected memory cell MC is not connected, according to a predetermined control signal /S upon reading. The load LD is a load equivalent to a load on a path from a local bit line to which the memory cell MC is connected, to the data bus lines LDB(0), LDB(1) through the global bit lines GBL(0), GBL(1). Further, the predetermined control signal /S is a signal generated based on a dedicated control signal or part of address signals or the address signals.

The current comparing portion D compares a current based on memory cell information flowing through the data bus line LDB(0) or LDB(1) with a reference current IRF flowing through the data bus line LDB(1) or LDB(0) as a reference current and detects it. The data bus lines LDB(0), LDB(1) are connected to a current load portion LI through an interface portion IF in the current comparing portion D. The current load portion LI supplies a current corresponding to the reference current IRF to the data bus lines LDB(0), LDB(1). A differential current between a current flowing through the data bus lines LDB(0), LDB(1) and a current from the current load portion LI is detected. This differential current is amplified by the differential amplifier 106 disposed at a subsequent stage, so that memory cell information is output as read-out data DATA.

As for components other than those described above, the same reference numerals between the conventional technology and the first embodiment indicate the same components, and thus a description thereof shall be omitted.

Next, each component of the memory core portion A, column selecting portion B, loading portion C and current comparing portion D will be described in order with reference to FIGS. 2 through 17.

Figure 2:
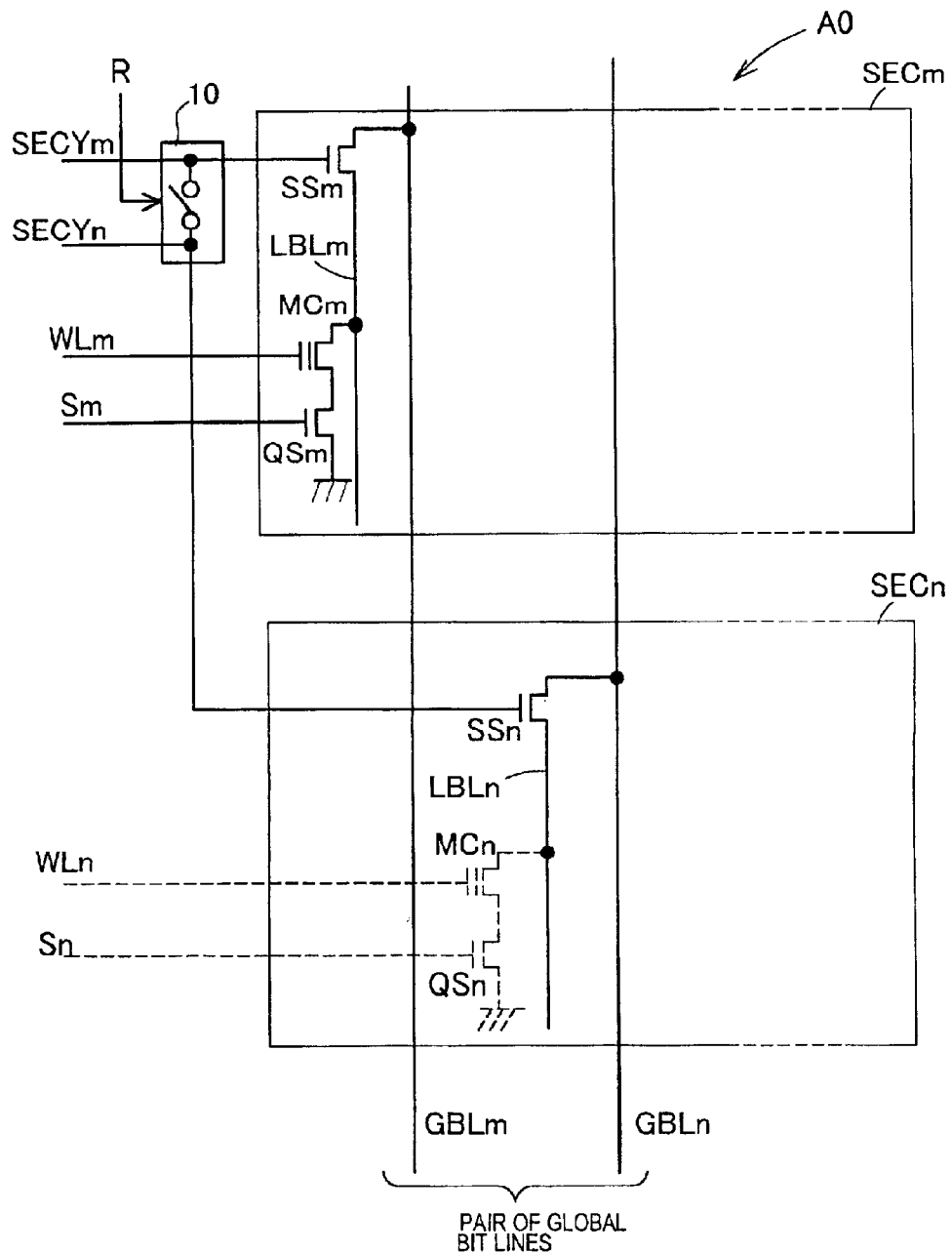
FIG. 2 is a circuit diagram showing a theoretical block diagram of a memory core portion of the first embodiment.

First, the memory core portion A will be described with reference to FIGS. 2 the 5. FIG. 2 is a theoretical block diagram of the memory core portion A0. The memory core portion A0 is divided to a plurality of sectors every predetermined number of the memory cells. In the sector, a plurality of local bit lines are disposed and a plurality of memory cells are connected to each local bit line. The memory cell comprises a nonvolatile transistor for storing memory cell information and a switch transistor for forming a current path to the reference potential when reading the memory cell information. The local bit line is connected to the global bit line through a sector switch. Adjacent two lines of the global bit line compose a pair and each sector is connected to the local bit line alternately. FIG. 2 shows two sectors SECm, SECn and local bit lines LBLm, LBLn are exemplified within the respective sectors SECm, SECn. Nonvolatile transistors MCm, MCn are connected to the local bit lines LBLm, LBLn and connected to the reference potential through switch transistors QSm, QSn to form memory cells. The local bit lines LBLm, LBLn are connected to global bit lines GBLm, GBLn through select switches SSm, SSn.

The select switches SSm, SSn are selected by control signals SECYm, SECYn and switch transistors QSm, QSn are selected by control signals Sm, Sn. Further, the nonvolatile transistors MCm, MCn are selected by word lines WLm, WLn. The control signals SECYm, Sm and word line WLm or control signals SECYn, Sn and word line WLn are activated to any selected sector SECm or SECn, so that a selected memory cell is connected to the global bit lines GBLm, GBLn so as to carry out a reading operation and a programming operation.

Upon the read-out operation, a circuit 10, which receives a read signal R, activates both of the control signals SECYm and SECYn at the same time. Although FIG. 2 indicates a case for short-circuiting the control signal SECYm with SECYn, it is not always necessary to short-circuit these signals as long as the object of activating the control signals SECYm and SECYn at the same time can be achieved. As for the other method, both of the control signals SECYm and SECYn generated by decoding, for example, the address signals or the like can be activated at the same time by reducing decoding layers by a single layer upon the read-out operation.

Consequently, while following a conventional access method in which the memory cell in which memory cell information is stored is selected for every sector SECm, SECn by the word lines WLm, WLn, the local bit line LBLn to which a selected memory cell is not connected can be connected to the global bit line GBLn adjacent the global bit line GBLm, from which the memory cell information is read out. The adjacent two global bit lines GBLm, GBLn can be made to perform the reading operation as a pair.

Figure 3:
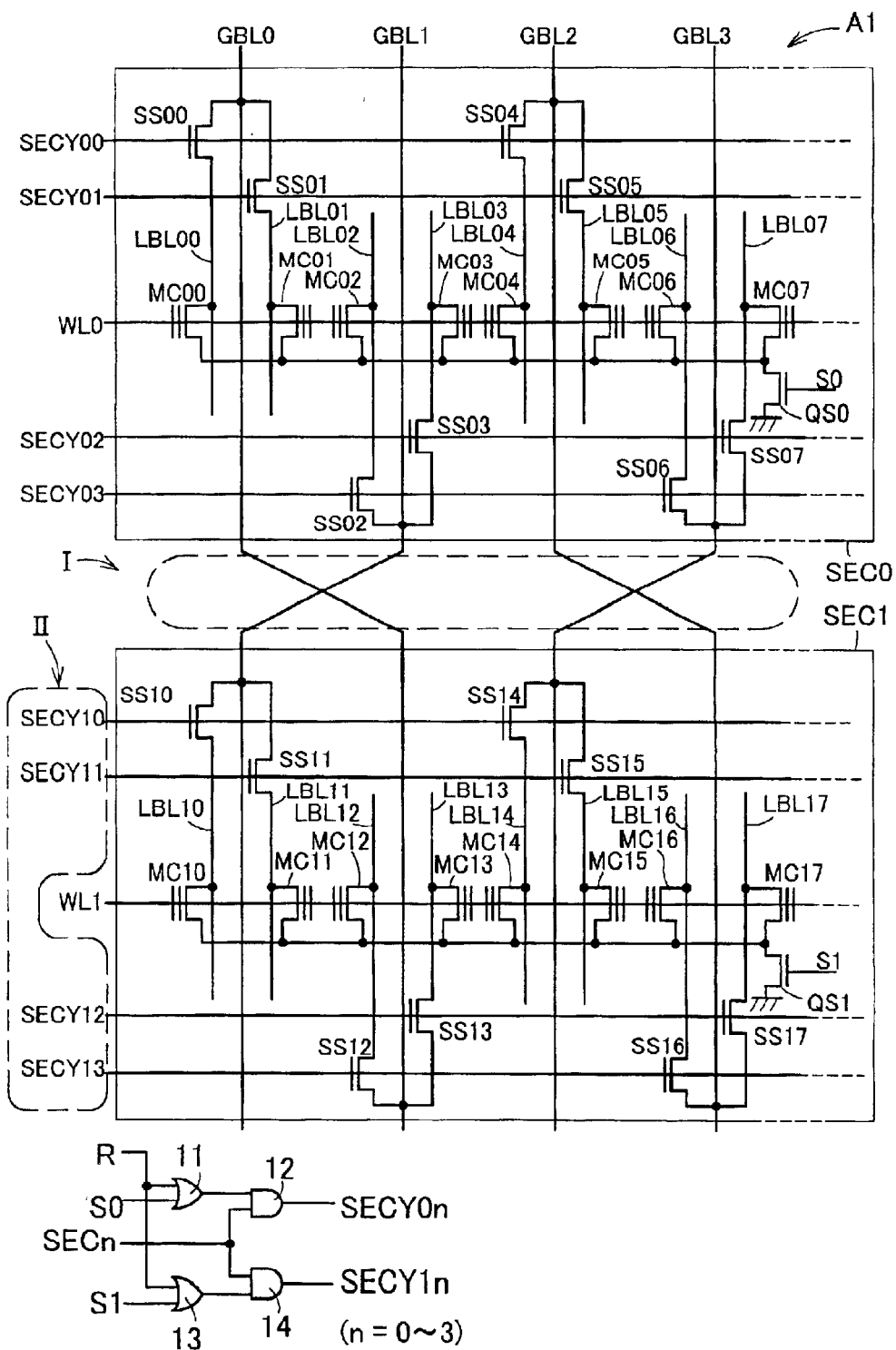
FIG. 3 is a circuit diagram showing a first example of the memory core portion.

An example of the memory core portion based on the theoretical block diagram of FIG. 2 is shown below. FIG. 3 shows a first example, in which two sectors SEC0, SEC1 in the memory core portion A1 are indicated. Here, a case where the memory cell disposed in the sector SEC0 is selected will be considered. The sector SEC0 is selected, so that a control signal S0 is activated and then, a switch transistor QS0 is activated. If the word line WL0 is activated, selected memory cells MC00 through MC07 are connected to respective local bit lines LBL00 through LBL07. Then, the local bit line is connected to the reference potential through the switch transistor QS0 so as to form a current path based on the memory cell information. If any one of the control signals SECY00, SECY03 is activated in the local bit lines LBL00 through LBL07, an appropriate sector switch SS00 through SS07 is selected, so that it is connected to an even-number or odd-number global bit lines GBL0, 2 or GBL1, 3 of the global bit lines GBL0 through GBL3.

Accompanied by selection of the local bit line by the sector switches SS00 through SS07, local bit lines LBL10 through LBL17 allocated under a similar relation in the adjacent not-selected sector SEC1 are connected to an appropriate global bit line. That is, corresponding to the control signals SECY00 through SECY03, control signals SECY10 through SECY13 are activated at the same time so that the local bit lines LBL00 through LBL07 and LBL10 through LBL17 in sectors SEC0 and SEC1 are connected to the global bit lines GBL0, GBL1, GBL2, GBL3. Because the local bit line in the not-selected sector SEC1 is connected to the same number of the memory cells as the local bit line in the selected sector SEC0 and the positional relationship of the local bit is similar to the case of the selected sector SEC1, and the physical parameter of the surrounding environment is the same, a similar parasitic capacitance is possessed. Further because the global bit lines connected to both the local bit lines are disposed adjacent each other, their physical parameters from the surrounding environment are equivalent and a similar parasitic capacitance is possessed.

According to the first example A1, when the local bit line of the selected sector SEC0 is connected and the memory cell information is read out by the both global bit lines acting as a pair, while the global bit lines GBL0 and GBL2 or GBL1 and GBL3 for transmitting the memory cell information act as the cell information side and the global bit lines GBL1 and GBL3 or GBL0 and GBL2, to which the local bit line of the not-selected sector SEC1 is connected act as the reference side, a load due to the parasitic capacitance existing on the path can be equalized ideally both on the cell information side and the reference side.

Because pairs of the global bit lines GBL0, GBL1 and GBL2, GBL3 are disposed adjacent each other, noise applied to one global bit line is propagated to the other global bit line, so that there is equivalent noise between the adjacent global bit lines. Therefore, an effect of noise can be canceled in read-out operation in which both the global bit lines act as a pair.

If by equalizing the connecting relationship in the sector SEC1 for the control signals SECY10 through SECY13 to the sector SEC0, the circuit configuration of a generating circuit (logical circuit of the lower part of FIG. 3) for the control signals SECY10 through SECY13 is made equivalent between the sectors (II in FIG. 3) and the global bit lines GBL0, GBL1 and GBL2, GBL3 each acting as a pair in the read-out operation are intersected (I in FIG. 3), the positional relationships of the local bit lines connected to the adjacent global bit lines GBL0, GBL1 and GBL2, GBL3 can be equalized. Consequently, the respective local bit lines connected to the adjacent global bit line have the same positional relationship between other local/global bit lines, word lines, other wires and peripheral structures of related components. Further, the adjacent global bit lines GBL0, GBL1 and GBL2, GBL3 intersect every sector and therefore, the positional relationship with peripheral structure is equalized. Thus, the parasitic capacitance formed between these peripheral structures can be equalized between both paths.

A generation circuit for generating the control signals SECY10 through SECY13 is indicated in the lower part of FIG. 3. A control signal SECn (n=0 through 3) indicating the position of a sector switch which should be connected to a global bit line subjected to decoding according to the address signals or the like is inputted to AND gates 12, 14. Output terminals of OR gates 11, 13 are connected to the other input terminals of the AND gates 12, 14. Control signals S0, S1 for selecting the sectors SEC0, SEC1 and the read-out signal R are inputted to the OR gates 11, 13. Because, in the case of program operation, any one of the OR gates 11, 13 is activated corresponding to a selected sector, any one of the AND gates 12, 14 is activated, so that the control signal SECY0n or SECY1n (n=0 through 3) is activated. As a result, only a sector switch leading to a selected memory cell is activated. However, in the read-out operation, the OR gates 11, 13 are activated together by the read-out signal R so that both the control signals SECY0n, SECY1n (n=0 through 3) are activated. Not only the sector switch to the selected memory cell, but also the local bit line located at the same position in the non-selected sector are connected to the adjacent global bit line.

Figure 4:
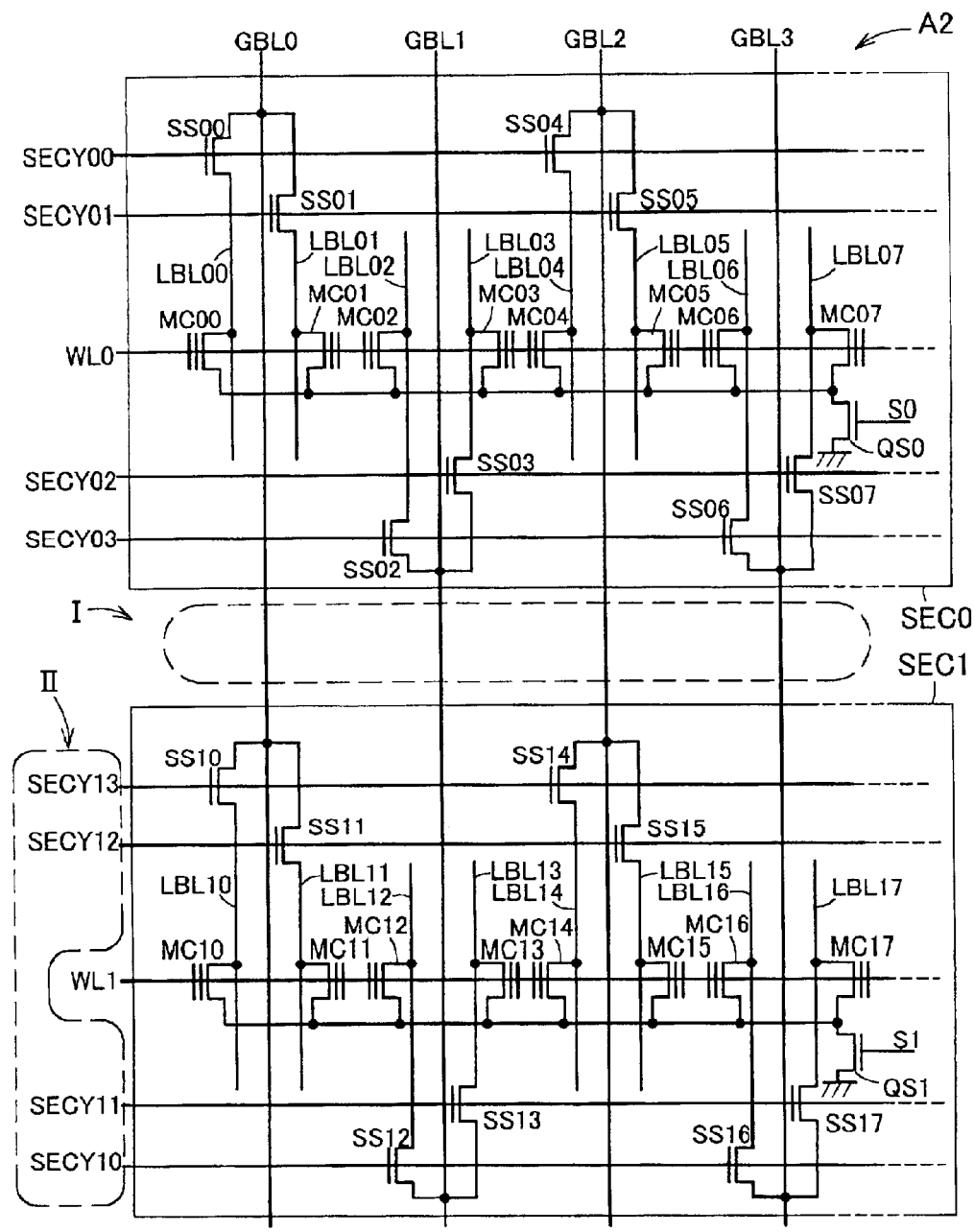
FIG. 4 is a circuit diagram showing a second example of the memory core portion.

FIG. 4 shows a second example A2. Its basic structure and operation are the same as the first example A1. This is different from the first example A1 in that the global bit lines do not intersect in each sector (I in FIG. 4). Accompanied by this, connecting relation of the control signals SECY10 through SECY13 in the sector SEC1 is different from that of the sector SEC0 (II in FIG. 4). By shifting the selecting position of the sector switch in the sector SECY10 relative to the sector SEC0 while outputting control signals SECY00 through SECY03 and control signals SECY10 through SECY13 by means of a generating circuit (logical circuit in the lower part in FIG. 3) of FIG. 3 at the same time, the local bit lines of the selected sector SEC0 and non-selected sector SEC1 are connected to adjacent global bit lines GBL0 and GBL1, GBL2 and GBL3. More specifically, selector switches SS00, SS04, SS12 and SS16 are selected with respect to the control signals SECY00 and SECY10. With respect to the SECY01 and SECY11, SS01 and SS05, SS13 and SS17 are selected. With respect to the SECY02 and SECY12, SS03 and SS07, SS11 and SS15 are selected. With respect to the SECY03 and SECY13, SS02 and SS06, SS10 and SS14 are selected.

According to a second example A2, when reading memory cell information with global bit line on the cell information side to which a selected local bit line is connected and global bit line on the reference side to which a non-selected local bit line is connected as a pair, a load of parasitic capacitance existing on a path can be equalized ideally between the cell information side and the reference side.

Further, because a pair of the global bit lines are disposed adjacent each other, noise applied to a global bit line is propagated to the other global bit line and there is equivalent noise between the global bit lines, so that noise of equivalent phase is applied between a pair of the global bit lines. By disposing a pair of the global bit lines adjacent each other, an effect of noise in reading operation with both the global bit lines as a pair can be canceled out.

According to a theoretical block diagram A0 of the memory core portion embodied in the first and second examples A1, A2, in the reading operation, the global bit line (GBLm or GBLn) on the cell information side and the global bit line (GBLn or GBLm) on the reference side having a similar path configuration are disposed adjacent each other as a pair. Consequently, irrespective of manufacturing variation or a variation in a chip or wafer face, a pair of the global bit lines GBLm, GBLn always possess equivalent parasitic capacitance, so that upon reading, similar transient response characteristic can be obtained in a stabilized condition. Therefore, even if sensing is carried out in a transient period before a potential change in a pair of the global bit lines GBLm, GBLn is settled to a balanced condition, memory cell information can be read out rapidly in a stabilized condition. Further, because noise of equivalent phase rides on both the paths, the noise is canceled out thereby improving reading reliability of memory cell information.

A local bit line (LBLn or LBLm) in the non-selected sector (SECn or SECm) adjacent the selected sector (SECm or SECn) can be used as a load on the reference side. Because the both sectors are located adjacent each other, a load by the parasitic capacitance and an effect of noise between the paths from the respective sectors SECm, SECn to the global bit lines GBLm, GBLn can be equalized.

Figure 5:
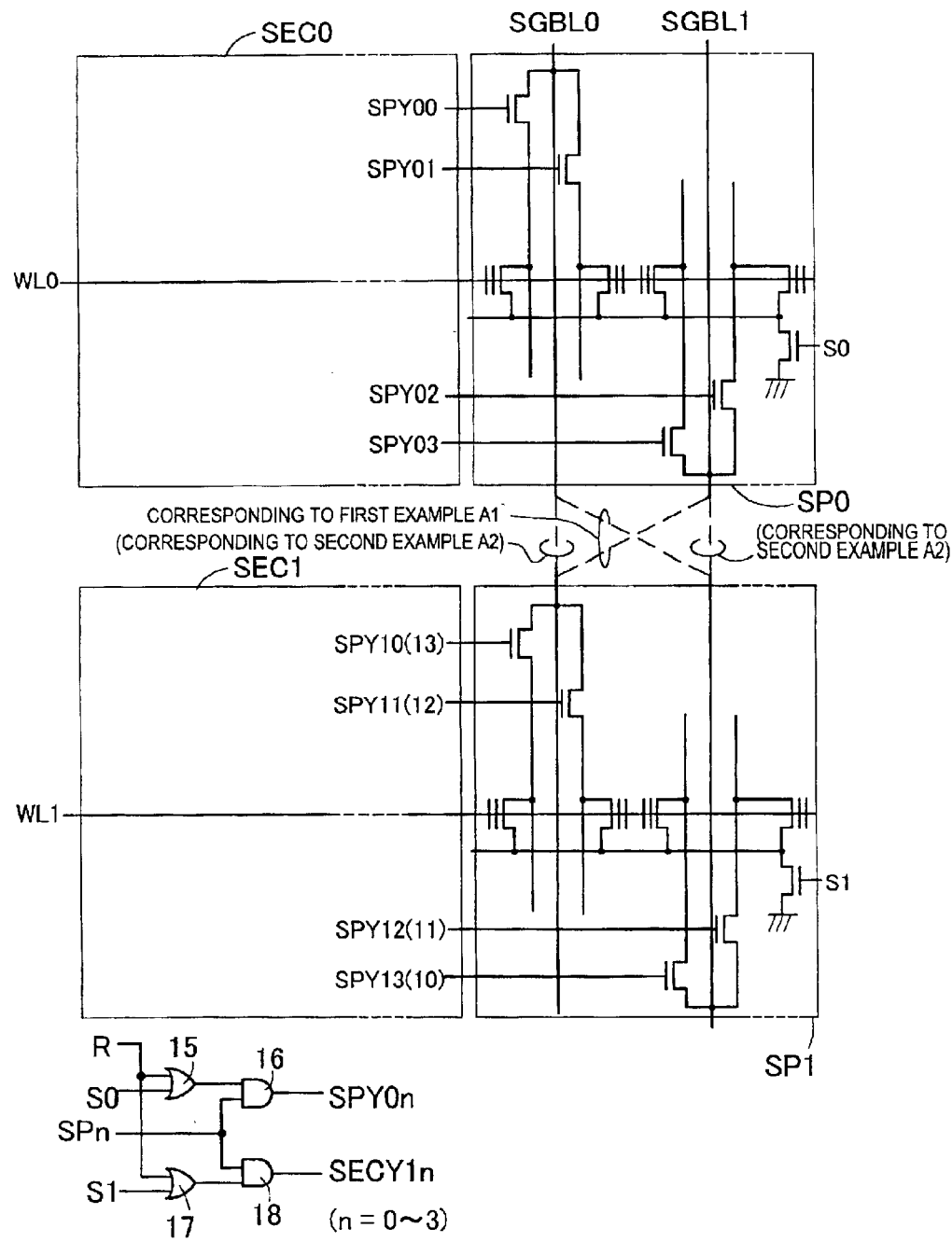
FIG. 5 is a circuit diagram showing redundant structures of the first and second examples of the memory core portion.

FIG. 5 shows redundant structures SP0, SP1 for restoring a defect according to the first, second examples A1, A2. The redundant structures SP0, SP1 are formed with the same configuration as a basic structure of reading connected to a pair of the global lines GBL0, GBL1 and GBL2, GBL3 as a minimum unit. FIG. 5 shows a structure with the global bit lines SGBL0, SGBL1 as a pair. Consequently, even if memory cell information is read out from the redundant structures SP0, SP1 by restoring a defect, the reading configuration can be maintained with the adjacent global bit lines SGBL0, SGBL1 as a pair, so that the same reading performance as when the redundant structures SP0, SP1 are not employed can be maintained. The connecting relation of the respective redundant structures SP0, SP1 of the global bit lines SGBL0, SGBL1 and the connecting relation between the control signals SPY00 through SPY03 and SPY10 through SPY13 are adjusted appropriately corresponding to the first and second examples A1, A2.

A generating circuit (logical circuit in a lower section of FIG. 4) for generating the control signals SPY00 through SPY13 is similar to the generating circuit for generating the control signals SECY00 through SECY13 shown in FIG. 3. In reading operation, both the control signals SPY0n and SPY1n (n=0 through 3) are activated by a control signal SPn (n=0 through 3) indicating a selector switch position in the redundant structures SP0, SP1, the control signals S0, S1 for selecting the sectors SEC0, SEC1 and the reading signal R.

Figure 6:
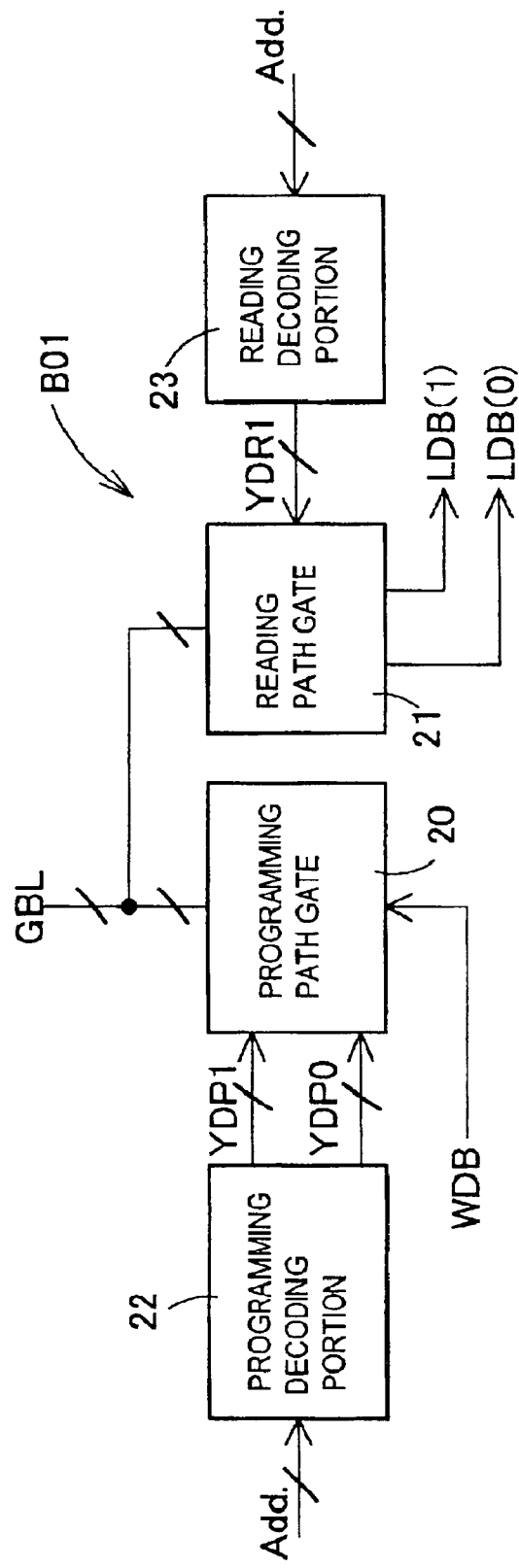
FIG. 6 is a circuit diagram showing a first theoretical block diagram of a column selecting portion of the first embodiment.
Figure 7:
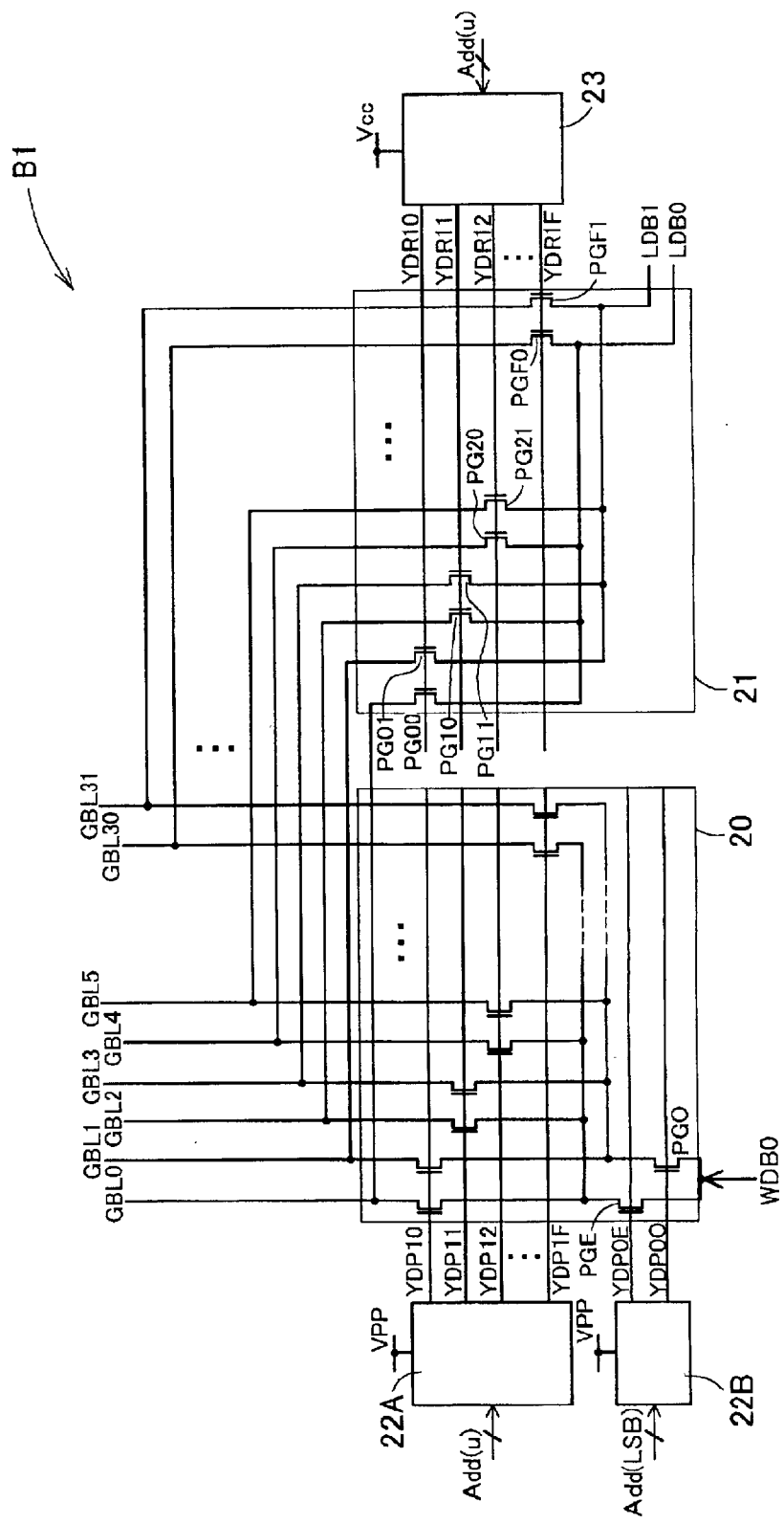
FIG. 7 is a circuit diagram showing a first example of the column selecting portion.
Figure 8:
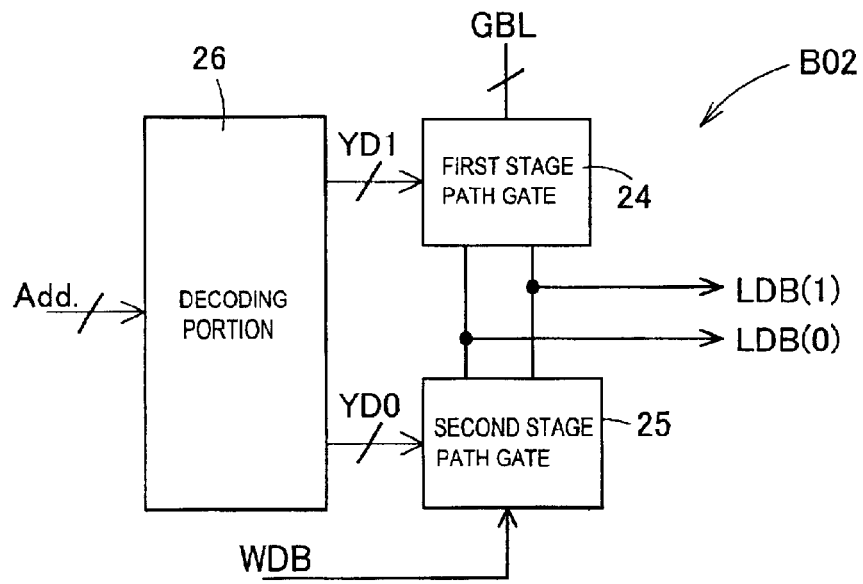
FIG. 8 is a circuit diagram showing a second theoretical block diagram of the column selecting portion of the first embodiment.
Figure 9:
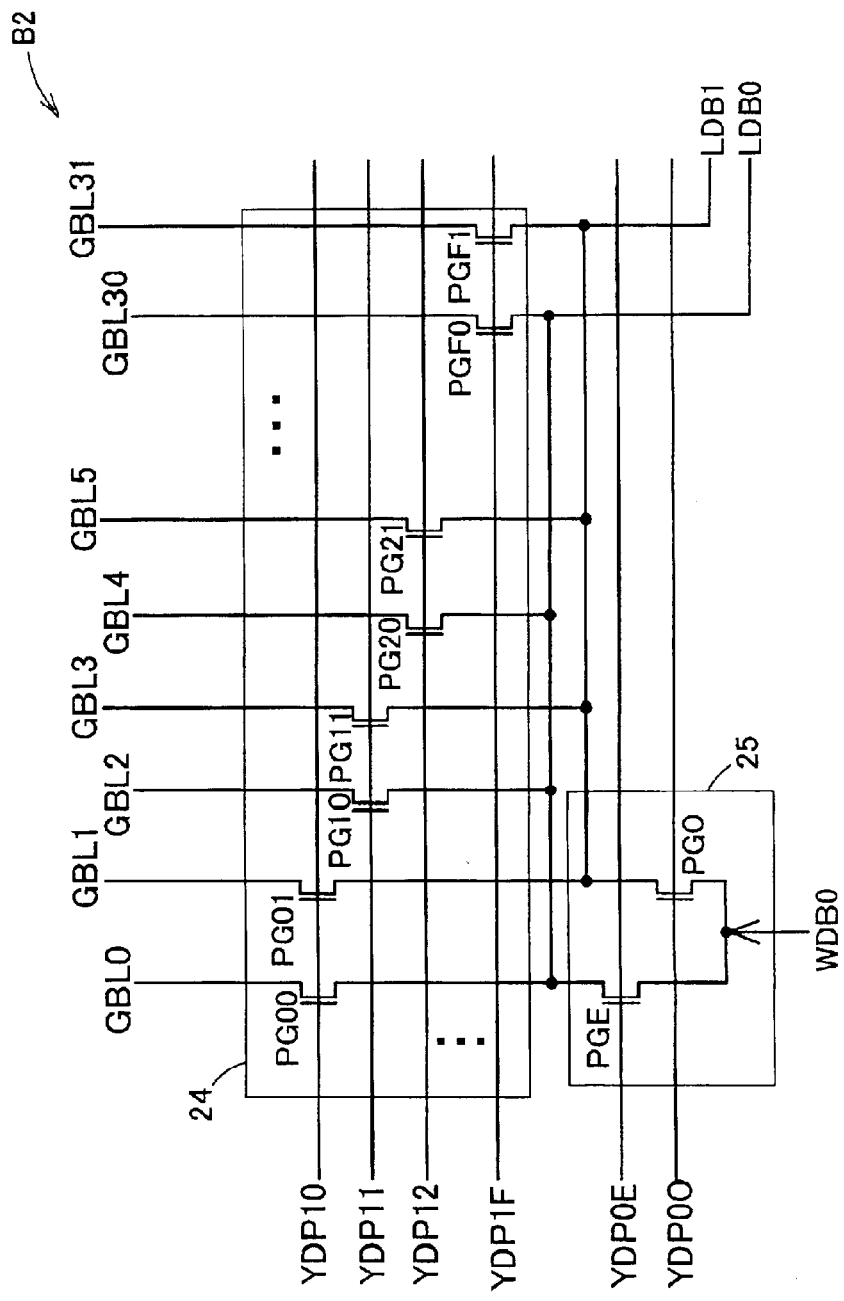
FIG. 9 is a circuit diagram showing a second example of the column selecting portion.

Next, a column selecting portion B will be described with reference to FIGS. 6 through 9. FIG. 6 is a first theoretical block diagram B01. An example thereof is indicated in FIG. 7 as a first example B1. FIG. 8 is a second theoretical block diagram B02 while an example thereof is indicated in FIG. 9 as a second example B2.

According to the first theoretical block diagram B01 of FIG. 6, connections between the global bit line GBL in the memory core portion A and external data buses (LDB: for reading, WDB: for programming) are carried out through each different path and a dedicated path gate (reading path gate 21, programming path gate 20) is provided. A pair of reading data buses LDB(0), LDB(1) are outputted form the reading path gate 21 and connected to a pair of the global bit lines. On the other hand, the writing data bus WDB is connected to the global bit line GBL in the programming path gate 20. A column selection signal for selecting a path gate (YDR1: for reading, YDP1, YDP0: for programming) is obtained by decoding an address signals Add by means of the respective reading decoding portion 23 and programming decoding portion 22.

According to the fist example B1 shown in FIG. 7, each adjacent pair of 32 global bit lines GBL0 through GBL31 is selected by 16 column selection signals YDR10 through YDR1F, YDP10 through YDP1F. Upon reading, this pair of the global bit lines are connected to a pair of the data buses LDB0, LDB1. In case of programming, any one of the pair of the global bit lines is selected by two column selection signals YDP0E, YDP0O and connected to the programming data bus line WDB0.

The reading side path gate 21 is controlled by 16 column selection signals YDR10 through YDR1F with two path gate transistors PG00, PG01 through PGF0, PGF1 as a pair. The memory cell information at the time of reading is a current signal and in order to prevent disturb phenomenon caused when unexpected voltage is applied to a nonvolatile memory cell, a voltage which appears in the global bit lines GBL0 through GBL31 upon reading is limited to about 0.5 V. Thus, a driving voltage for the column selection signals YDR10 through YDR1F does not have to be so high. In FIG. 7, the path gate 21 is driven by a power supply voltage VCC of its peripheral logical circuit. Although a concrete voltage of the power supply voltage VCC depends upon process technology, for example, 3 V, 2.5 V, 1.8 V or the like can be considered. That is, the reading decoding portion 23 for outputting column selection signals YDR10 through YDR1F by decoding the address signals Add(u) can be constructed with the same device as the peripheral logical circuit so that it can be operated at high speeds.

Figure 24:
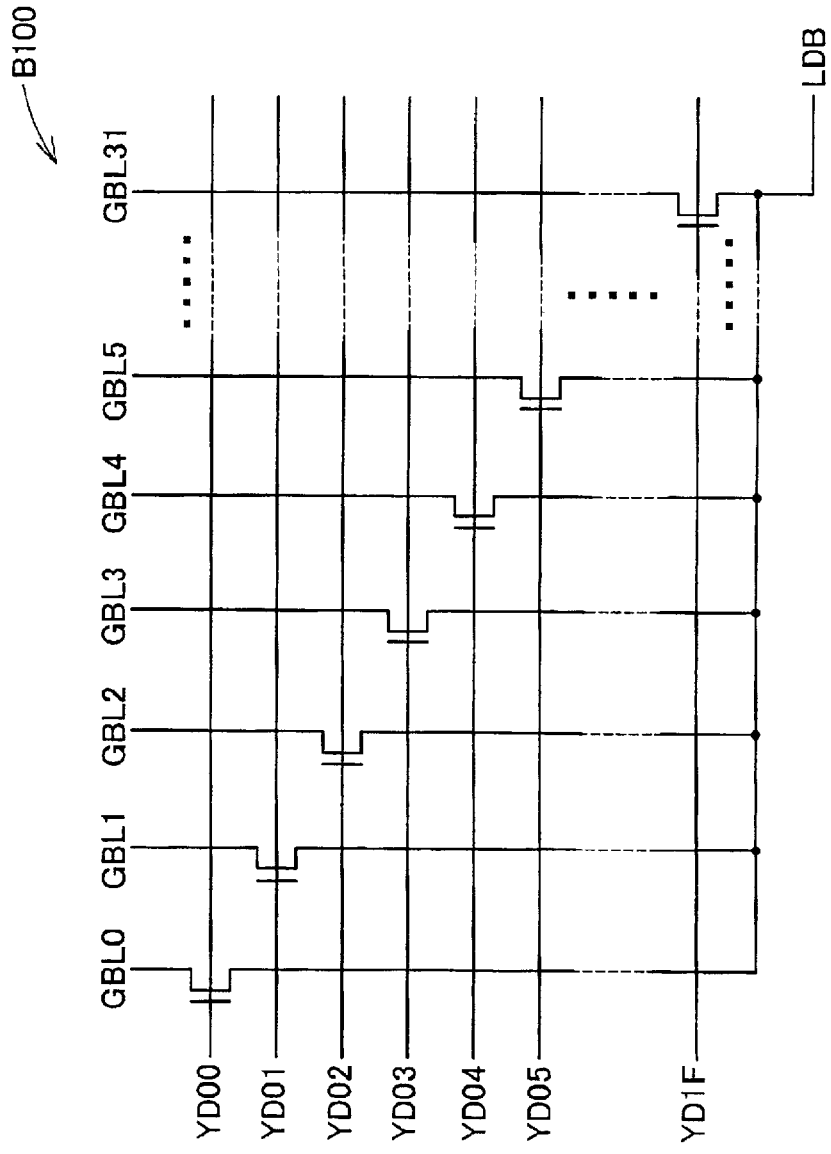
FIG. 24 is a circuit diagram showing a conventional column selecting portion.
Figure 25:
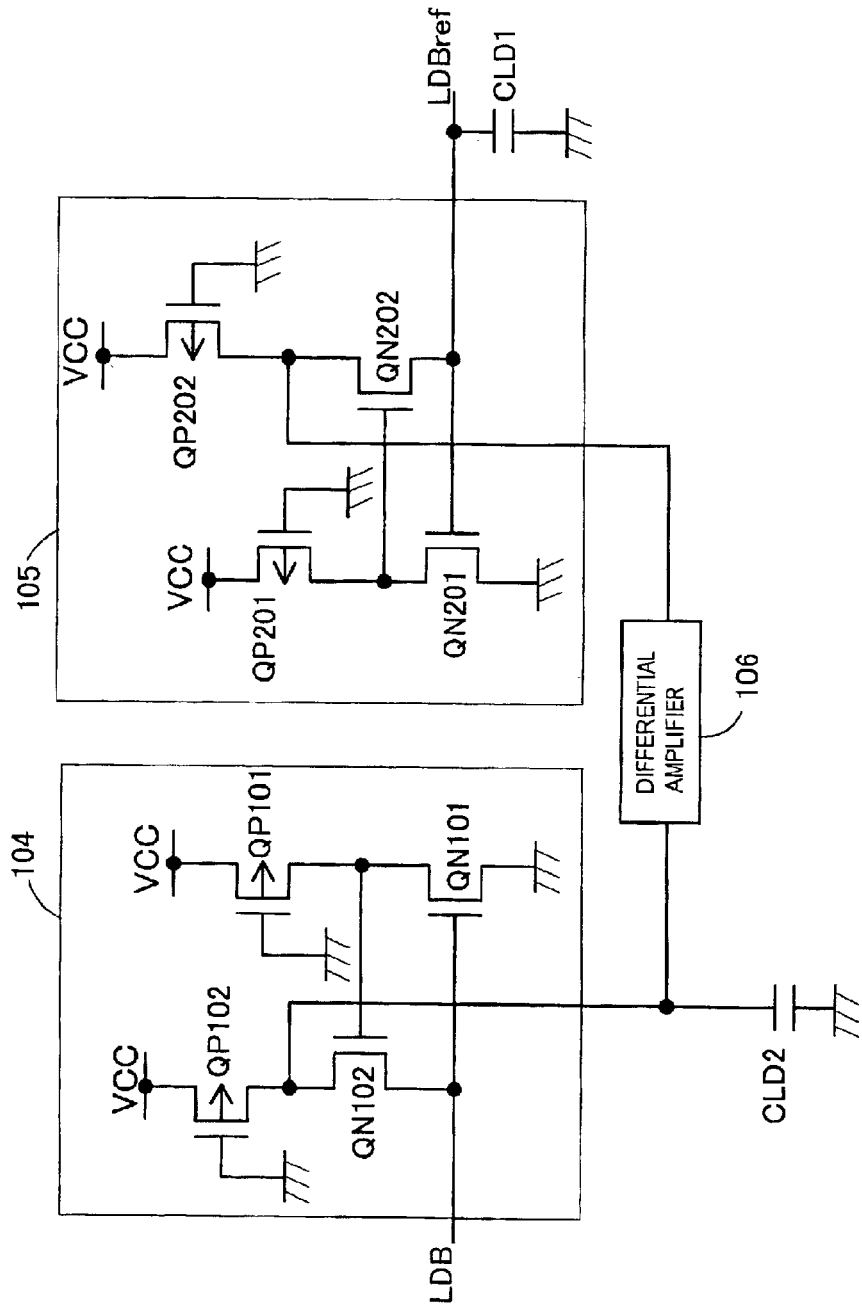
FIG. 25 is a circuit diagram showing a conventional comparing portion.

The path gate transistors PG00, PG01 through PGF0, PGF1 are dedicated for reading and therefore, a high driving performance transistor (FIG. 24) serving for programming at the same time is not necessary unlike the conventional technology. Because the reading current is small compared to when programming, the driving performance can be set small and the gate capacitance can be also set small. Accompanied by high-speed operation of the reading decoding portion 23, the path gate transistors PG00 through PGF1 can be switched rapidly, so that acceleration of current path selection from the global bit line to the data bus lines LDB0, LDB1 can be achieved.

The programming side path gate 20 comprises a first stage having the same structure as the reading side for selecting a pair from 16 pairs each composed of two path gate transistors according to the column selection signals YDP10 through YDP1F and a second stage for selecting any one of a selected pair according to the column selection signals YDP0E, YDP0O. The programming data bus WDB0 is connected to any one of the global bit lines GBL0 through GBL31. A first-stage programming decoding portion 22A for outputting the column selection signals YDP10 through YDP1F decodes an upper level address signals Add(u) and a second-stage programming decoding portion 22B for outputting the column selection signal YDP0E, YDP0O decodes a lowest level address signal Add(LSB).

Because in the programming operation, the carrier needs to be programmed by applying a programming voltage VPP to the nonvolatile memory cell, the path gate transistor needs a high voltage resistance and high current driving performance. The programming decoding portions 22A, 22B for driving this path gate transistor are also driven by a high-voltage program voltage VPP. By constructing these components with high voltage resistance elements, the programming operation can be executed accurately. Because the path gate transistor needs a transistor size having a driving capacity higher than a predetermined driving power, the programming decoding portions 22A, 22B for driving this transistor need an appropriate driving power. By constructing the configuration of the path gate 20 with two stages, the quantity of driving circuits in the programming decoding portions 22A, 22B can be compressed while maintaining an appropriate driving power so as to reduce an occupied area on a chip. Therefore, while a single-stage configuration (FIG. 24) based on the conventional technology requires 32 sets of the driving circuits, the system shown in FIG. 7 is comprised of 18 sets of the driving circuits.

According to the column selecting portion B1 (theoretical block diagram B01) of the first example, when an appropriate pair of the global bit lines are selected from a predetermined number of the global bit lines GBL0 through GBL31, address signals Add(u), Add(LSB) and the like need to be decoded. Because a pair of the global bit lines are selected upon reading, decoding hierarchy can be set up shallower than upon writing so that the column selecting portions 21, 23 for reading can be formed compact.

Further when reading and programming of memory cell information, as the path gate transistors, those having small/large current driving powers are prepared. Both upon reading and programming, the global bit line and the data bus line can be connected to each other under an optimum current driving performance.

According to the second theoretical block diagram of FIG. 8, the path gate is comprised of a first stage path gate 24 for selecting a pair from the global bit lines GBL and connecting these to a pair of the reading data bus lines LDB(0), LDB(1) and a second stage path gate 25 for selecting any one of a pair of the data bus lines LDB(0), LDB(1) and connecting this to the programming data bus WDB. The second stage path gate 25 is added to the first stage path gate which is a reading current path so as to form a programming current path. The column selection signals YD1, YD0 for selecting a path gate are obtained by decoding the address signals Add by means of the decoding portion 26. The column selection signal YD1 is used for selecting the first stage path gate 24 and the column selection signal YD0 is used for selecting the second stage path gate.

The path gate of the second example shown in FIG. 9 has the same structure as the path gate 20 on the programming side according to the first example B1 shown in FIG. 7. Connecting points between the first stage path gate 24 and the second stage path gate 25 are assumed to be a pair of the data buses LDB0, LDB1 for reading. According to the column selection signals YDP10 through YDP1F, a pair of the path gate transistors are selected from 16 pairs of the path gate transistors PG00 and PG01 through PGF0 and PGF1 so as to connect a pair of the global bit lines GBL0 and GBL1 through GBL30 and GBL31 to the reading data buses LDB0, LDB1. The column selection signals YDP0E, YDP0O selects any one of the path gate transistors PGE, PGO so as to connect any one of the data buses LDB0, LDB1 to the programming data bus WDB0.

In the programming operation, the first stage and second stage path gates 24, 25 are both constructed of a high voltage resistance transistor because the programming voltage VPP needs to be applied to the nonvolatile memory cell. While the current driving power for reading can be reduced, a high current driving is needed upon programming. While suppressing the parasitic capacitance component by reducing the driving power of the transistors PG00 through PGF1 of the first stage path gate 24, the transistors PGE, PGO of the second stage path gate 25 are provided with a sufficient driving power to reduce ON resistance. Consequently, the parasitic capacitance of the reading path is kept small and resistance component to be inserted into a programming path as ON resistance of two transistors is maintained small by the two path gates 24, 25, so that an excellent program characteristic can be secured.

Because in the second example B2, the path gate and the decoding portion are used partly in common by the reading side and the programming side, the column selecting portion B2 can be constructed with a compact number of elements.

Figure 10:
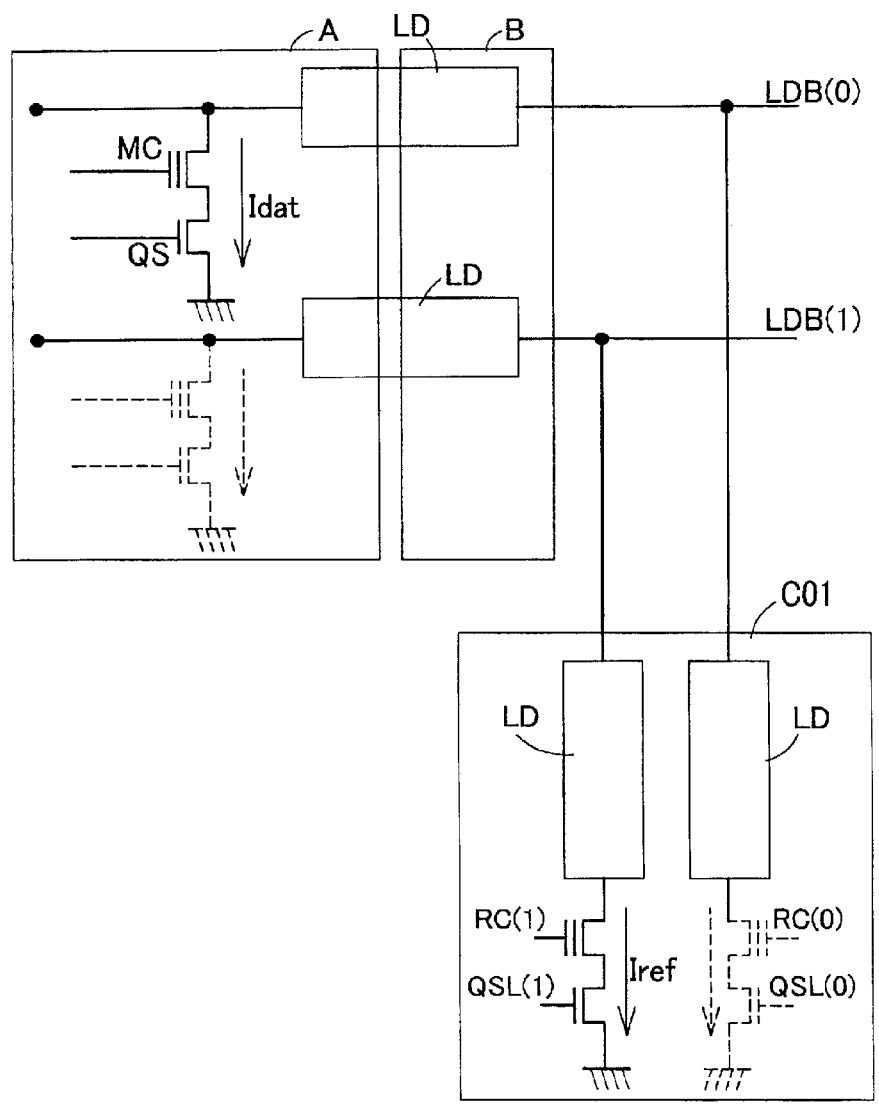
FIG. 10 is a circuit diagram showing the first theoretical block diagram of a loading portion of the first embodiment.

Next, the loading portion C will be described with reference to FIGS. 10 through 14. FIG. 10 is a first theoretical block diagram C01 of the loading portion C. The loading portion C01 is so constructed as to connect the load LD, the nonvolatile memory cells RC(0), RC(1) having the same structure as the nonvolatile memory cell MC and the switch transistors QSL(0), QSL(1) to each of the reading data bus lines LDB(0), LDB(1) having the same structure as the switch transistor QS in the memory core portion A. Here, the load LD is a load LD similar to a load existing on a path leading from the local bit line in the memory core portion A to the data bus lines LDB(0), LDB(1) through the column selecting portion B. The nonvolatile memory cells RC(0), RC(1) and the switch transistor QSL(0), QSL(1) are reference cells, which supply a reference current Iref for detecting a current Idat based on memory cell information stored in the nonvolatile memory cell MC and switch transistor QS. The switch transistors QSL(0), QSL(1) are controlled so as to supply the reference current Iref to the data bus line LDB(1) making a pair with the data bus line LDB(0) in which the current Idat flows.

In the first example C1 shown in FIG. 11, similar load portions are connected to the respective data bus lines LDB0, LDB1. The respective loading portions include reference cell portions 33, 34 and selecting portions 31, 32 having switch transistors QSL0, QSL1, which are connected between the data bus lines LDB0, LDB1 and reference potential in this order.

The reference cell portions 33, 34 contain reference cells RC0, RC1, transistors PGL0 and SSL0, PGL1 and SSL1 as the load LD. The transistors SSL0, SSL1 have the same structure as the sector switches (SSm, SSn in FIG. 2, SS00 through SS17 in FIGS. 3, 4) for connecting the local bit line to the global bit line. The transistors PGL0, PGL1 have the same structure as the path gate transistor (PG00 through PGF1 in FIGS. 7 and 9) comprising the reading path gates 21, 24 in the column selecting portions B1, B2. By applying the power supply voltage VCC to gates of these transistors, the same load LD as transistors existing on a path leading from the local bit line up to the data bus lines LDB0, LDB1 is constructed. Meanwhile, the gates of the reference cells RC0, RC1 are controlled by the reference selection signals Y01, Y00 for controlling switch transistors QSL0, QSL1, which will be described later, or a signal having the same phase.

The switch transistors QSL0, QSL1 are provided between the reference cell portions 33, 34 and the reference potential and any one thereof is selected by the reference selection signals Y01, Y00 obtained by decoding the lowest level address signal Add (LSB). Here, the data bus line LDB1 or LDB0 making a pair with the data bus lines LDB0 or LDB1, to which a memory cell, from which information is read out is connected, is selected.

In the loading portion C01 having the first theoretical structure shown in the first example C1, the loading portion C1 (C01 in the first theoretical block diagram) connected to each of the data bus lines LDB0, LDB1 supplies the reference current Iref serving as a reference to the current Idat flowing through the data bus line LDB0 or LDB1 based on the memory cell information to the data bus lines LDB1 or LDB0. Further, the loading portion C1 is so constructed to possess the same loads PGL0 and SSL0, PGL1 and SSL1 (FIG. 11) as the load (FIG. 10) existing on a path leading from the nonvolatile memory cell MC up to the data bus lines LDB0, LDB1. Because the loads are mutually equivalent, a pair of the data bus lines LDB0, LDB1 including current paths of current Idat and reference current Iref based on the memory cell information have the same structure, so that the reading operation with the data bus lines LDB0, LDB1 as a pair can be carried out securely irrespective of manufacturing variation or a variation in the wafer face.

The loading portion C1 (C01 in the first theoretical block diagram) is provided with the same reference cells RC0, RC1 as the nonvolatile memory cell MC. Because these reference cells RC0, RC1 generate the reference current Iref, the reference current Iref having an excellent matching with the current Idat based on the memory cell information of the nonvolatile memory cell MC can be generated irrespective of manufacturing variation or a variation in a chip or wafer face, so that the reading operation with the data bus lines LDB0, LDB1 acting as a pair can be carried out securely.

Further, the reference cells RC0, RC1 can also be disposed in a region different from a region in which the nonvolatile memory cell for storing memory cell information is disposed. Consequently, a voltage stress applied to the nonvolatile memory cell MC upon programming or the like is not applied to the reference cells RC0, RC1, so that characteristic changes in the reference cells RC0, RC1 are not induced. Thus, a stabilized reference current Iref can be generated.

The switch transistors QSL0, QSL1 for connecting the reference cells RC0, RC1 to the reference potential can be set up to the same load as the switch transistor QS which is a load connected to the source side of the nonvolatile memory cell MC. As a result, loads on the current path of the current Idat and the reference current Iref, based on the memory cell information, can be matched at a high precision.

Figure 12:
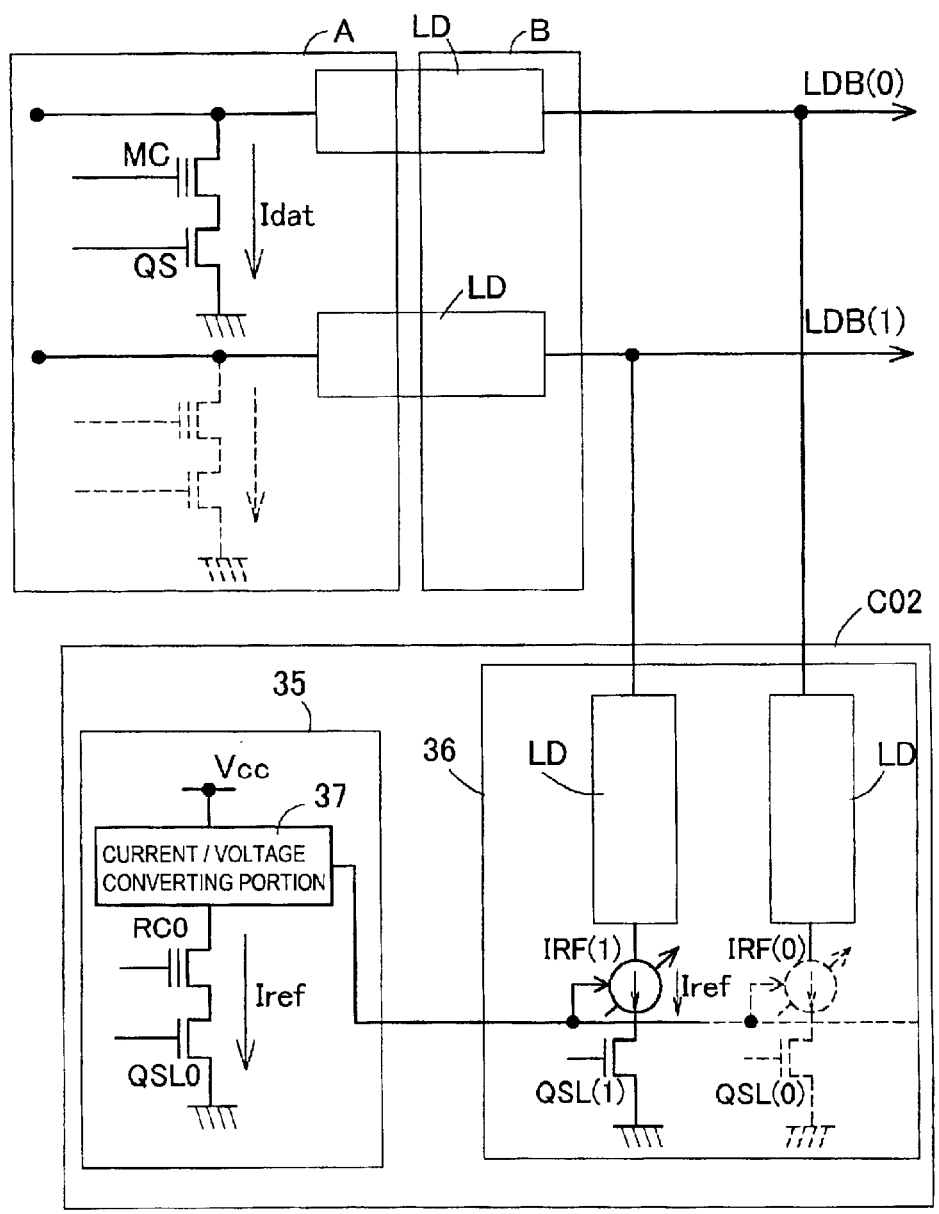
FIG. 12 is a circuit diagram showing a second theoretical block diagram of a loading portion of the first embodiment.

FIG. 12 is a second theoretical block diagram C02 of the loading portion C. The loading portion C02 contains a loading portion 36 comprising voltage control current sources IRF(0), IRF(1) instead of the nonvolatile memory cells RC(0), RC(1) as well as a load LD, a switch transistor QSL(0) and QSL(1) like the structure shown in the first theoretical block diagram C01. Further, it has a regulator portion 35 comprising the same nonvolatile memory cell RC0 and switch transistor QSL0 as the nonvolatile memory cell MC and switch transistor QS in the memory core portion A so as to generate the reference current Iref and a current/voltage converting portion 37 for converting this reference current Iref to a voltage value. The loading portion C02 outputs a current corresponding to the reference current Iref from the loading portion 36 by controlling the voltage control current sources IRF(0), IRF(1) by a regulation voltage outputted corresponding to the reference current Iref. The switch transistor QSL(0) or QSL(1) is selected like the first theoretical diagram C01. On the other hand, the nonvolatile memory cell RC0 and the switch transistor QSL0 are always selected, and generate the reference current Iref in its reading operation.

Figure 13:
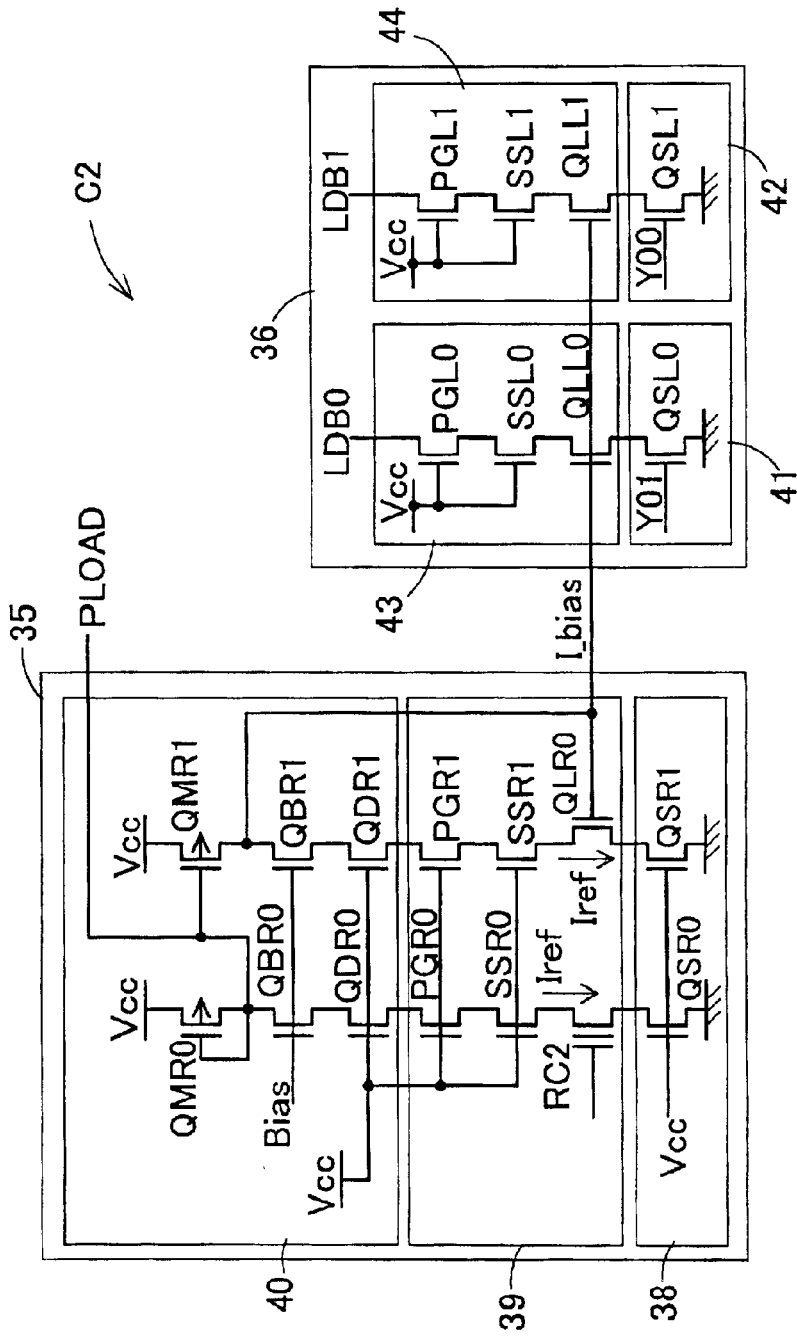
FIG. 13 is a circuit diagram showing a second example of the loading portion.

According to the second example C2 shown in FIG. 13, the loading portion 36 comprises reference cell portions 43, 44 and selecting portions 41, 42 each having switch transistors QSL0, QSL1, like the first example C1. The second example C2 is different from the first example C1 in that transistors QLL0, QLL1 are inserted into the reference cell portions 43, 44 as load portions controlled by regulation voltage I_bias instead of the nonvolatile memory cells RC0, RC1. Meanwhile, these load transistors QLL0, QLL1 have the same structure as a load transistor QLR0 of a regulating portion 35, which will be described later.

Figure 16:
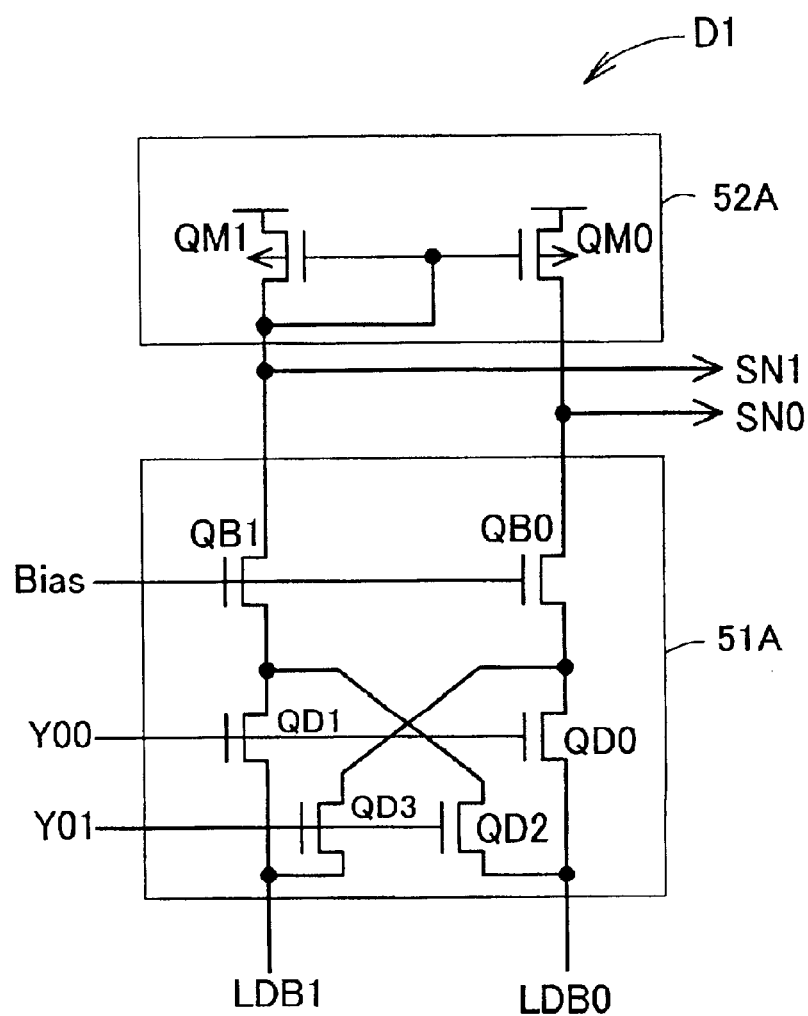
FIG. 16 is a circuit diagram showing a first example of the current comparing portion.
Figure 17:
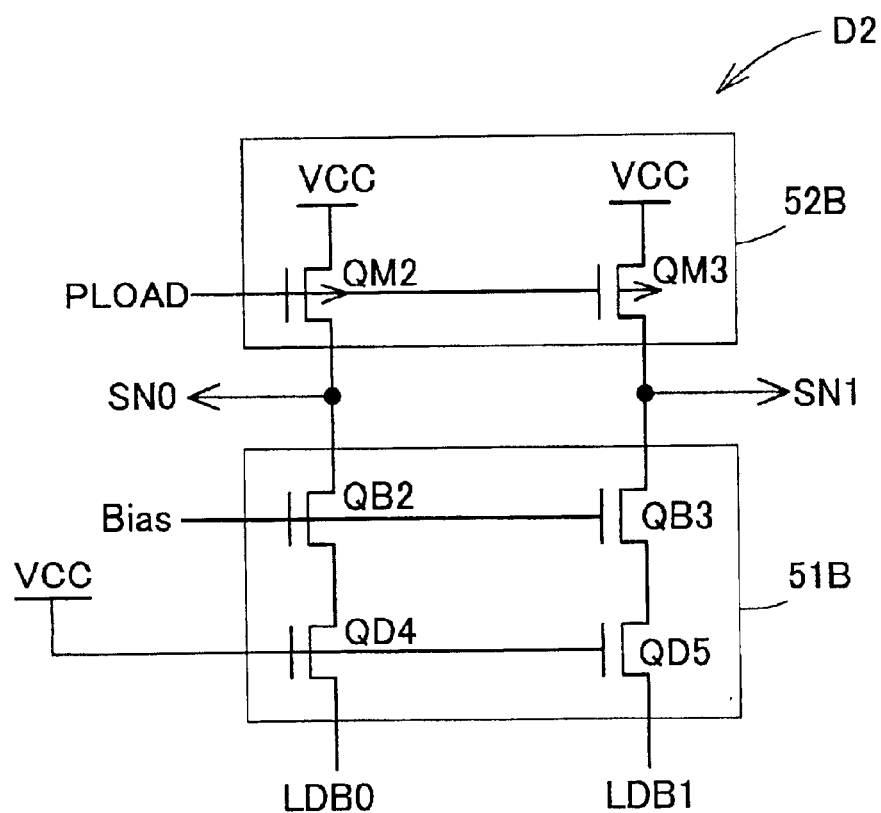
FIG. 17 is a circuit diagram showing a second example of the current comparing portion.

The regulating portion 35 containing a nonvolatile memory cell RC2 as a reference cell, is comprised of a selecting portion 38, a reference cell portion 39 and a bias portion 40. Further, the regulating portion 35 is comprised of a reference current generating portion (left side of the regulating portion 35 in FIG. 13) for generating the reference cell Iref and a regulation voltage generating portion (right side of the regulating portion 35 in FIG. 13) for converting the reference current Iref to a regulation voltage I_bias. As for this configuration, the selecting portion 38 and reference cell portion 39 are basically the same as the selecting portions 31, 32 and reference cell portions 33, 34 in the first example C1. The different points are that gates of the switch transistors QSR0, QSR1 of the selecting portion 38 are connected to the power supply voltage VCC and that the transistor QLR0 is inserted into the regulation voltage generating portion of the reference cell portion 39 as a load portion instead of the nonvolatile memory cell. The reason for applying the power supply voltage VCC to the switch transistors QSR0, QSR1 is to always activate the regulating portion 35 upon reading and the reason for replacing with the transistor QLR0 of the load portion is to generate the regulation voltage I_bias. The bias portion 40 has a current mirror portion (transistors QMR0, QMR1) for mirroring the reference current Iref generated by the reference current generating portion to the regulation voltage generating portion. Further, in order to match the relation between current and voltage in the regulating portion 35 with the relation between current comparing portions D1, D2, which will be described later, and the loading portion 36, the bias portion 40 contains transistors QBR0, QBR1 and transistors QDR0, QDR1 corresponding to the bias transistors QB0 through QB3 and voltage-dividing transistors QD0 through QD5 (FIGS. 16 and 17). Further, PLOAD is outputted from a gate terminal of the current mirror portion and used in the current comparing portion D2.

In the regulation voltage generating portion of the regulating portion 35, a gate terminal of the load portion transistor QLR0 and a drain terminal of the current mirror portion QMR1 are connected to each other in order to generate a regulation voltage I_bias corresponding to the mirrored reference current Iref. If the transistor QMR1 constituting the current mirror portion is activated in a saturation condition, the transistor QMR1 of the current mirror portion is operated in a high-output impedance condition. Because the transistor QMR1 can be maintained at substantially the same current as the reference current Iref without depending upon the drain voltage, the regulation voltage I_bias is controlled so that this current Iref also flows to the load transistor QLR0. This regulation voltage I_bias is inputted to the gate terminals of the load transistors QLL0, QLL1 of the loading portion 36. Because the regulating portion 35 has the same structure as the loading portion 36 including the current comparing portions D1, D2, which was described previously, the reference current also flows to the loading portion 36.

Figure 14:
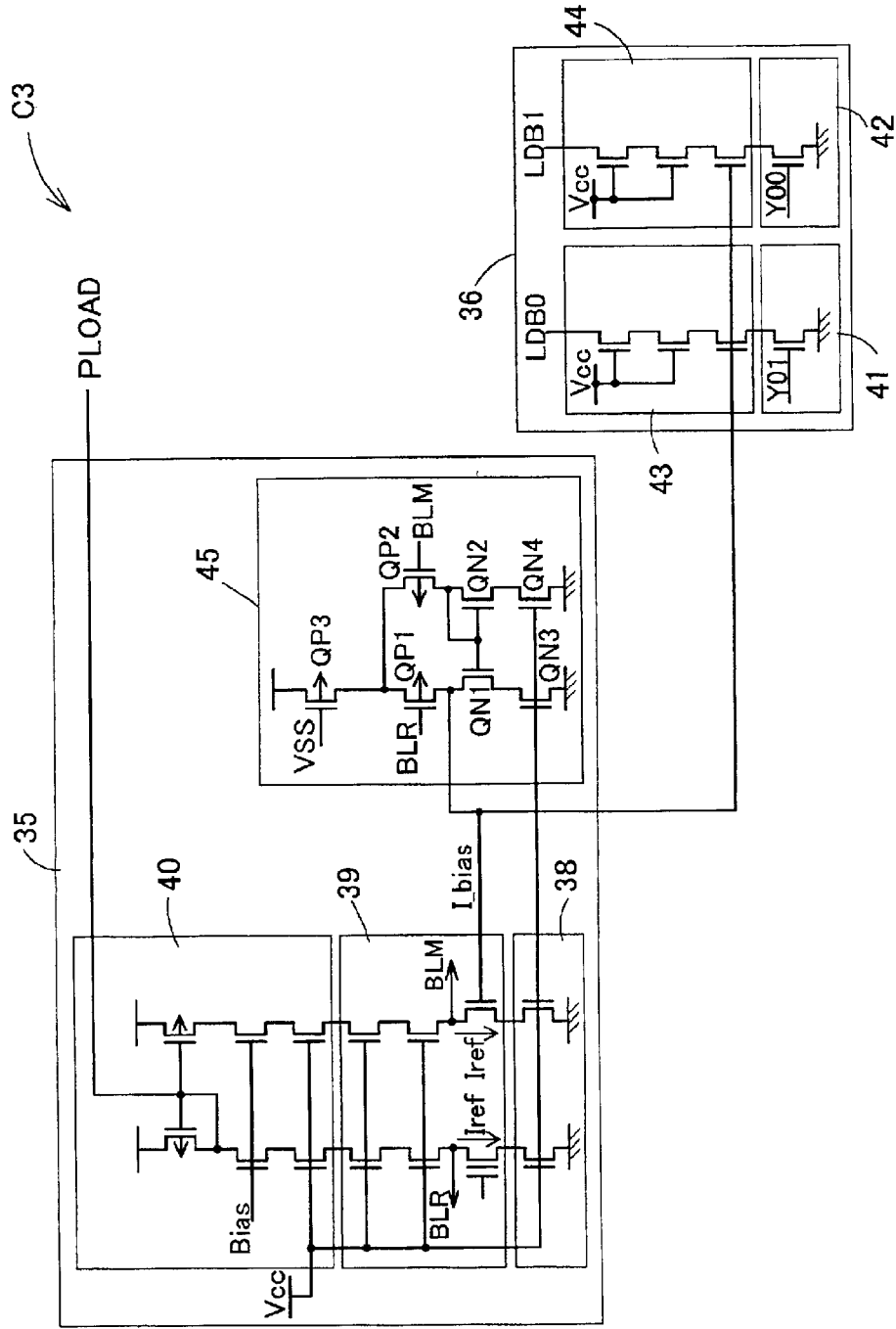
FIG. 14 is a circuit diagram showing a third example of the loading portion.

FIG. 14 shows a third example C3. Because its basic structure is the same as the second example C2, a description thereof is omitted. According to the third example C3, the regulating portion 35 is provided with an operational amplifier 45 in order to generate the regulation voltage I_bias. The operational amplifier 45 is comprised of input differential pair transistors QP1, QP2 and active load transistors QN1, QN2 and if they are activated by the switch transistors QN3, QN4, bias current flows from the current source transistor QP3 so as to carry out an operational amplification operation. A drain potential of the nonvolatile memory cell and a drain potential of the load portion transistor in the reference cell portion 39 are inputted to the input differential pair transistors QP1, QP2 so as to control the regulation voltage I_bias so that both the potentials are equivalent to each other.

In the loading portion C02 of the second theoretical structure shown in the second and third examples C2, C3, a single nonvolatile memory cell RC2 can satisfy the requirement of the nonvolatile semiconductor storage device as a reference cell and therefore, it is not necessary to provide each loading portion 36 therewith. If the nonvolatile semiconductor storage device is constituted of multiple bit outputs, a pair of data bus lines having an appropriate bit width is necessary for each of the multiple bit outputs and the loading portions 36 are connected to each thereof. In this case also, a single nonvolatile memory cell RC2 can satisfy the requirement. The quantity of the nonvolatile memory cells RC2 can be minimized thereby contributing to reduction of the die size. Further, adjustment of characteristic variation which should be considered when a plurality of the nonvolatile memory cells RC2 are provided is not necessary, which is convenient.

In the loading portion 36, equivalent loads PGL0 and SSL0, PGL1 and SSL1 (FIG. 13) to the load LD (FIG. 10) existing on a path from the nonvolatile memory cell MC, are connected to both the data bus lines LDB0, LDB1 so that the reference current flows to any one thereof. Consequently, the data bus lines LDB0, LDB1, which serve as a pair, including the loading portion 36 come to have the equivalent structure. Therefore, these examples are the same as the first example C1 in that reading operation can be carried out securely irrespective of manufacturing variation or a variation in a chip or wafer face, an effect of voltage stress is not received and the characteristic of the reference cell RC2 is not changed because the nonvolatile memory cell RC2 existing in the loading portions C2, C3 is disposed in a different region from the nonvolatile memory cell MC in which memory cell information is stored, and the load balance can be matched at a higher accuracy by insertion positions of the switch transistors QSL0, QSL1.

Figure 15:
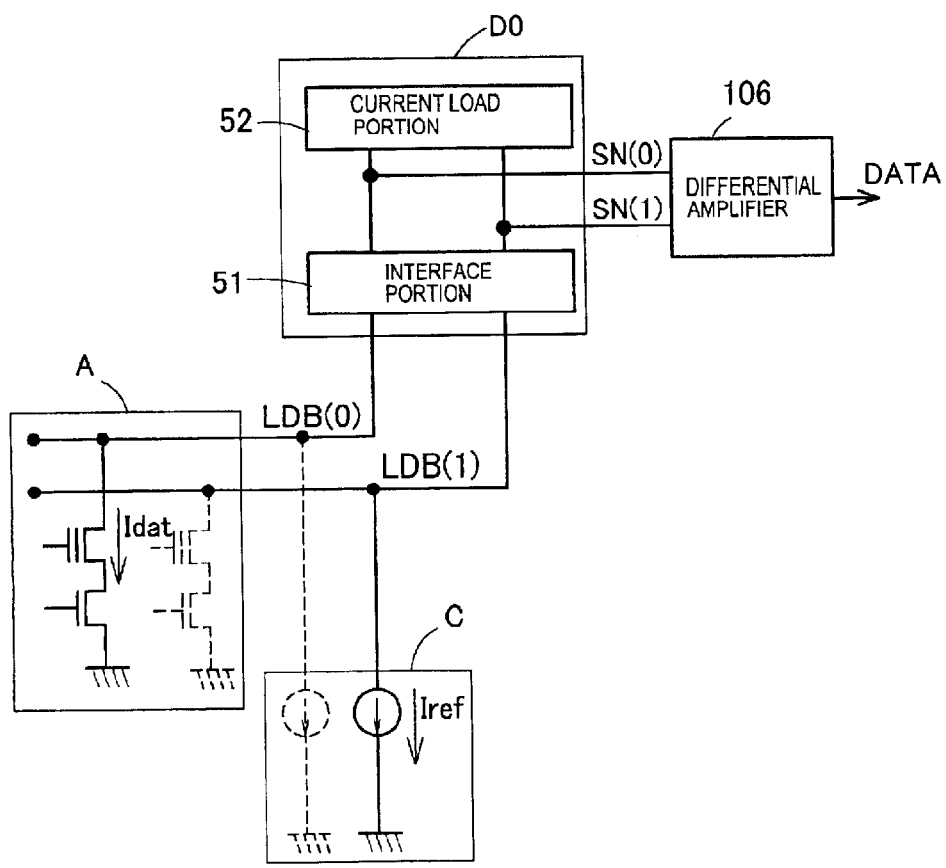
FIG. 15 is a circuit diagram showing a theoretical block diagram of a current comparing portion of the first embodiment.

The current comparing portion D will be described with reference to FIGS. 15 through 17. FIG. 15 is a theoretical block diagram of the current comparing portion D0. After a selected memory cell is connected, the current Idat flowing to the data bus line LDB(0) or LDB(1) and based on memory cell information and the reference current Iref flowing through the data bus line LDB(1) or LDB(0), which serve as a pair, from the loading portion C are inputted to the current comparing portion D0. The inputted currents Idat, Iref are connected to a current load portion 52 through an interface portion 51. If a current from the current load portion 52 is set to a predetermined current corresponding to the reference current Iref, a current obtained by subtracting the predetermined current from the inputted respective currents Idat, Iref are calculated. A differential current between the both appears at differential output terminals SN(0), SN(1) in the form of just its current value or a differential voltage obtained by converting the differential current to an appropriate voltage level through an interface. If this differential signal is amplified by a differential amplifier 106 on a post stage, the memory cell information can be obtained as data DATA. Here, an interface portion 51 has functions of shifting the differential output terminals SN(0), SN(1) to an appropriate voltage level, adjusting the voltage levels of the data bus lines LDB(0), LDB(1) and switching connecting relation between the data bus lines LDB(0), LDB(1) and the current load portion 52.

According to the first example D1 shown in FIG. 16, the interface portion 51A comprises connection changing portions QD0 through QD3 for changing a connection between the data bus lines LDB0, LDB1 and the current load portion 52A appropriately and bias portions QB0, QB1 for restricting a voltage applied to the data bus lines LDB0, LDB1, regardless of the voltage of the differential output terminals SN0, SN1. The current load portion 52A is constituted of an independent current mirror circuit and by connecting a gate and a drain of the transistor QM1, a reference side transistor is formed and further by connecting a gate terminal of the transistor QM0, current is mirrored.

The connection changing portions QD0 through QD3 of the interface portion 51A changes connection so that the data bus line LDB0 or LDB1 in which the reference current Iref flows is connected to a reference side transistor QM1 in the current mirror circuit of the current load portion 52A. If the data bus line LDB0 is located on the reference side, the transistors QD2, QD3 are turned on according to the control signal Y01 and if the data bus line LDB1 is located on the reference side, the transistors QD0, QD1 are turned on according to the control signal Y00. Consequently, the reference current Iref is inputted to the reference side of the current mirror circuit so that a current equivalent to the reference current is mirrored to an opposite side. Further, the bias portions QB0, QB1 restrict voltages of the data bus lines LDB0, LDB1 to a voltage lower than the bias voltage Bias by a threshold voltage irrespective of setting voltages at differential output terminals SN0, SN1. An operating voltage set up at the differential output terminals SN0, SN1 from the power supply voltage VCC through the current load portion 52A needs to be located within a tolerable range with respect to the input voltage range of a differential amplifier 106, which will be described later. Although this voltage depends on the input circuit configuration of the differential amplifier 106, generally it is a specified intermediate voltage with respect to the power supply voltage VCC. Because upon reading, a path to the nonvolatile memory cell MC (FIG. 1) is secured in the data bus lines LDB0, LDB1, there is a fear that a disturb phenomenon may occur or an unexpected programming operation may be caused in the nonvolatile memory cell (FIG. 1) if a voltage applied to the data bus lines LDB0, LDB1 is excessive. The bias portions QB0, QB1 are inserted to satisfy requirements of both. Because the potential of the data bus lines LDB0, LDB1 is preferred to be about 0.5 V in order to prevent the disturb phenomenon, the bias voltage Bias is set up to about 0.5 V+threshold voltage.

If the data bus lines LDB0, LDB1 are loaded with a high voltage VPP or the like according to a program, the connection changing portions QD0 through QD3 need to be constructed of a high voltage resistance element. On the other hand, because the control signals Y00, Y01 pass through the connection changing portions QD0 through QD3 upon reading under the potential of the data bus lines LDB0, LDB1 of about 0.5 V, they can be driven with a low voltage such as the power supply voltage VCC. Even if the data bus lines LDB0, LDB1 are loaded with a high voltage VPP or the like under this setting, a voltage lower than the power supply voltage VCC is applied to the differential output terminals SN0, SN1. As a result, the current load portion 52A and the differential amplifier 106 can be constructed with a low voltage resistance element, thereby achieving a rapid reading operation. If the column selecting portion B2 shown in FIG. 9 is used, the data bus lines LDB0, LDB1 may be loaded with a high voltage VPP or the like.

In the second example D2 shown in FIG. 17, an interface portion 51B is different from the interface portion 51A and the voltage dividing portions QD4, QD5 are provided instead of the connection changing portions QD0 through QD3 while further the bias portions QB2, QB3 are provided. In a current load portion 52A, constant current transistors QM2, QM3 to which a gate terminal PLOAD of a current mirror portion outputted in the second example C2 of the load portion shown in FIG. 13 are constructed. The transistors QM2, QM3 form a current mirror circuit together with the current mirror portions QMR0, QMR1 in the second example C2 of the load portion. Therefore, a current equivalent to the reference current flows through the constant current transistors QM2, QM3. Thus, a differential current can be detected like the first example irrespective of which is located on the reference side, the data bus line LDB0 or LDB1.

Voltage dividing portions QD4, QD5 provided instead of the connection changing portions QD0 through QD3 of the first example exert the same effect as the voltage dividing effect of the connection changing portions QD0 through QD3, thereby restricting voltages on the differential output terminals SN0, SN1 with respect to a high voltage on the data bus lines LDB0, LDB1. Further, bias portions QB2, QB3 exert the same operation and effect as the bias portions QB0, QB1.

According to the current comparing portions D1, D2 of the first and second examples, memory cell information is read out based on a differential current between the current Idat based on memory cell information and the reference current Iref supplied from the current load portions.

Figure 18:
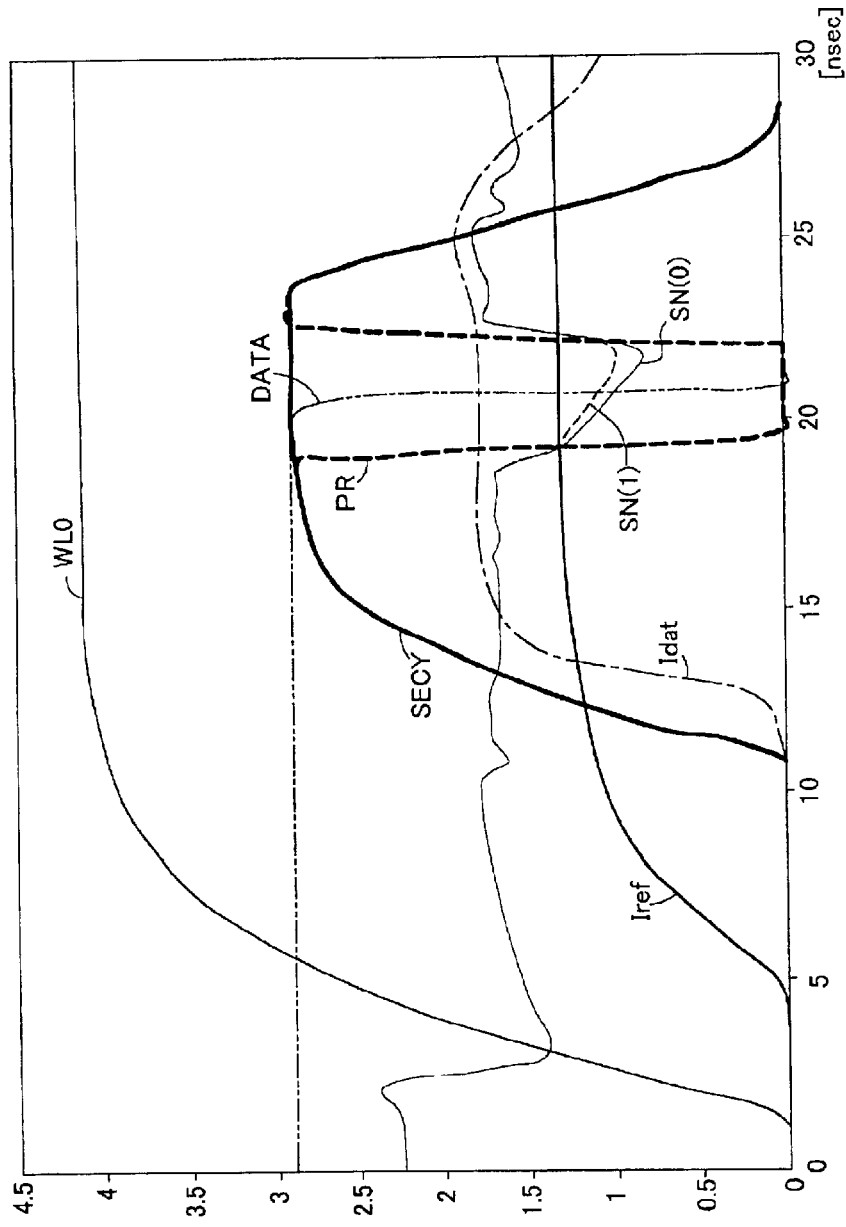
FIG. 18 is an operating waveform diagram showing a read operation of the first embodiment.

FIG. 18 shows an operating waveform obtained by circuit simulation on a reading operation in the nonvolatile semiconductor memory device (FIG. 1) of the first embodiment. FIG. 18 shows a result of the simulation carried out on a flash memory which is a nonvolatile semiconductor memory device of 64 M bits or the equivalent, made according to process technology of 0.18 μm rule, with the power supply voltage VCC set at 2.9 V.

If the word line WL0 is activated, the memory cell MC disposed in a selected sector in the memory core portion A is selected and the loading portion C starts its operation several nanoseconds after the word line WL0 is activated, so that the reference current Iref begins to flow to the data bus line LDB(1). Although a path gate of the column selecting portion B is selected (not shown), no sector switch is selected at this time so that no current Idat based on the memory cell information flows to the data bus line LDB(0). Substantially 5 nsecs after the reference current Iref is outputted, the control signal SECY is activated so as to select a sector switch thereby connecting the local bit line to the global bit line. Because at this time, the path gate of the column selecting portion B is turned on, the global bit line is connected to the data bus line LDB(0) and substantially 1 nsec after the control signal SECY is activated, the memory cell current Idat is outputted. After the memory cell current Idat is stabilized, a pre-charge signal PR is reset substantially 6 nsecs after a rise-up of the memory cell current Idat so as to release pre-charge on the current comparing portion D. At the same time when the pre-charge is released, comparison of the currents Idat, Iref is started in the current comparing portion D and a potential difference based on a difference of current appears between the differential output terminals SN(0) and SN(1). When this potential difference widens to about 50 mV, the differential amplifier 106 of a latter stage is activated so as to output memory cell information as data DATA. Only about 1 nsec after the pre-charge signal PR is reset, the memory cell information DATA is outputted. By ideally equalizing loads connected to a pair of the data bus lines LDB(0), LDB(1) to minimize a parasitic capacitance accompanying a path gate and the like and excluding a voltage stress on the nonvolatile cell generating the reference current Iref to carry out differential amplification to the stabilized reference current Iref, memory cell information can be defined in an initial transient response period of the reading operation, so that a rapid reading operation is achieved. Further, because load balance between a pair of the data bus lines LDB(0) and LDB(1) is excellent, the pre-charge can be carried out rapidly, so that acceleration of cycle time in continuous reading operation is achieved at the same time.

According to the first embodiment shown in FIG. 1 and second to fourth embodiments to be described later, by combining concrete examples of the memory core portion A, column selecting portion B, loading portion C and current comparing portion D described above, appropriately, the nonvolatile semiconductor memory device of the present invention can be constructed.

The present invention is not restricted to the first embodiment, and, needless to say, may be improved or modified within a scope not departing from the purpose of the present invention.

For example, although a case in which the local bit lines LBLm, LBLn connected to a pair of the global bit lines GBLm, GBLn (FIG. 2) are disposed in adjacent sectors SECm, SECn has been described in the first embodiment, the present invention to is not restricted to this example, but the local bit lines may be disposed adjacent each other. In a memory core portion A20 according to a second embodiment shown in FIG. 19, as shown in sector SEC0, adjacent local bit lines LBL00 and LBL01, LBL02 and LBL03 are disposed so as to be connected to adjacent global bit lines GBL0, GBL1 through each sector switch. If the respective word lines WL00, WL01 are controlled so as to select SEC00 and SECY01 or SECY02 and SECY03, the adjacent local bit lines LBL00 and LBL01, LBL02 and LBL03 can be connected to the adjacent global bit lines GBL0, GBL1, with one set to a selected memory cell side while the other one set to the reference side. Consequently, noise applied to any one of the local bit lines LBL00 and LBL01, LBL02 and LBL03 and the global bit lines GBL0, GBL1 is propagated to the other one, so that equivalent noise is applied to a pair of lines. That is, the local bit lines LBL00 and LBL01, LBL02 and LBL03 and the global bit lines GBL0, GBL1 can cancel the effect of the noise. Therefore, the reading reliability of memory cell information is improved.

Even if a pair of the local bit lines are not disposed at corresponding positions between the adjacent sectors SEC0 and SEC1 as shown in the first embodiment (FIGS. 3 and 4)

or not adjacent each other in the same sector as shown in the second embodiment (FIG. 19), equivalent parasitic capacitance can be secured by disposing a pair of the local bit lines at positions whose physical parameters based on the surrounding environment are equivalent. That is, if as exemplified by the memory core portion A30 according to a third embodiment shown in FIG. 20, a pair of the bit lines BL0, BL1 are disposed at positions whose physical parameters based on the surrounding environment such as symmetrical positions are equivalent, the parasitic capacitance possessed by both the bit lines BL0, BL1 can be equalized.

Figure 19:
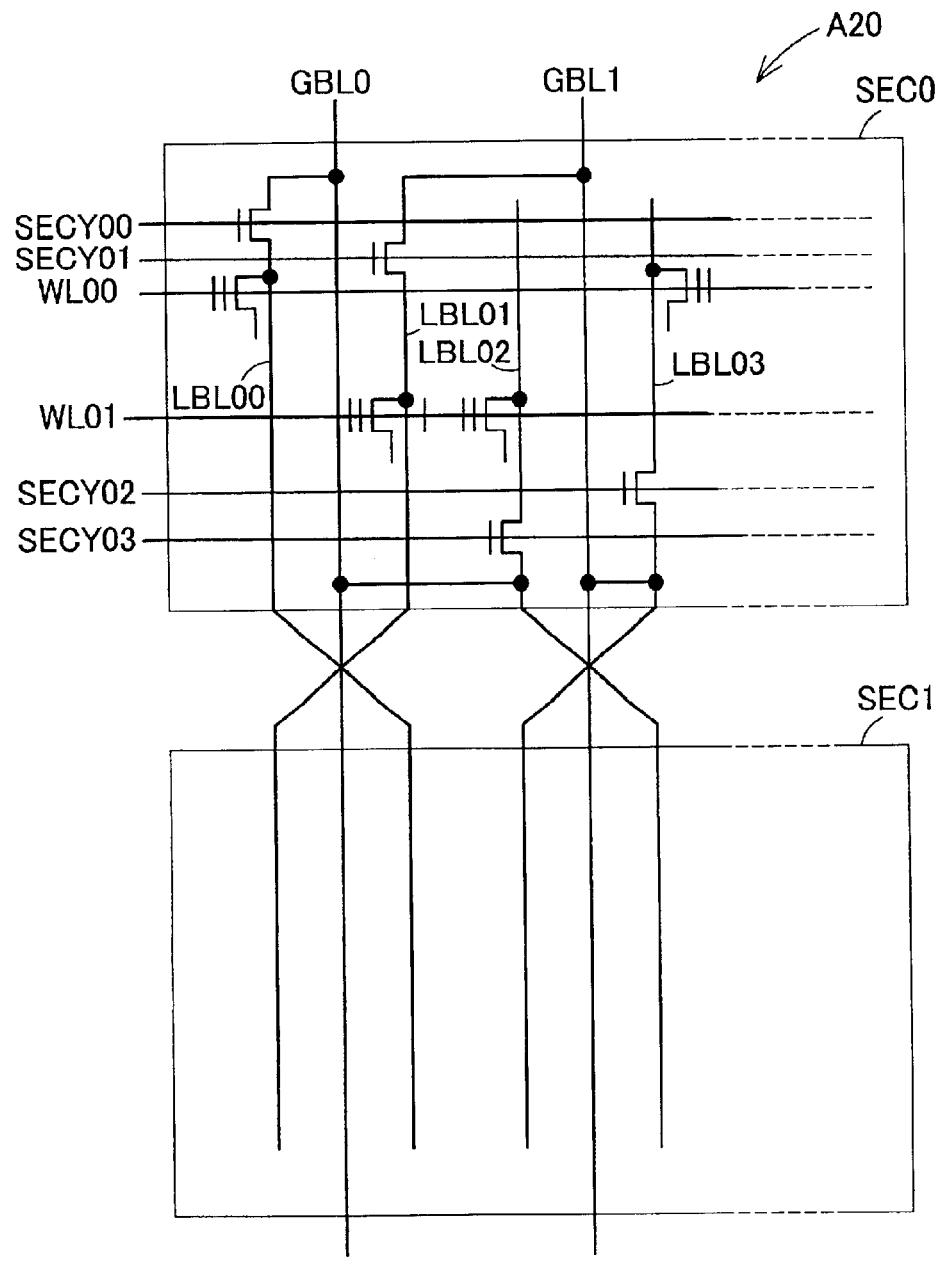
FIG. 19 is a circuit diagram showing a memory core portion of a second embodiment.
Figure 20:
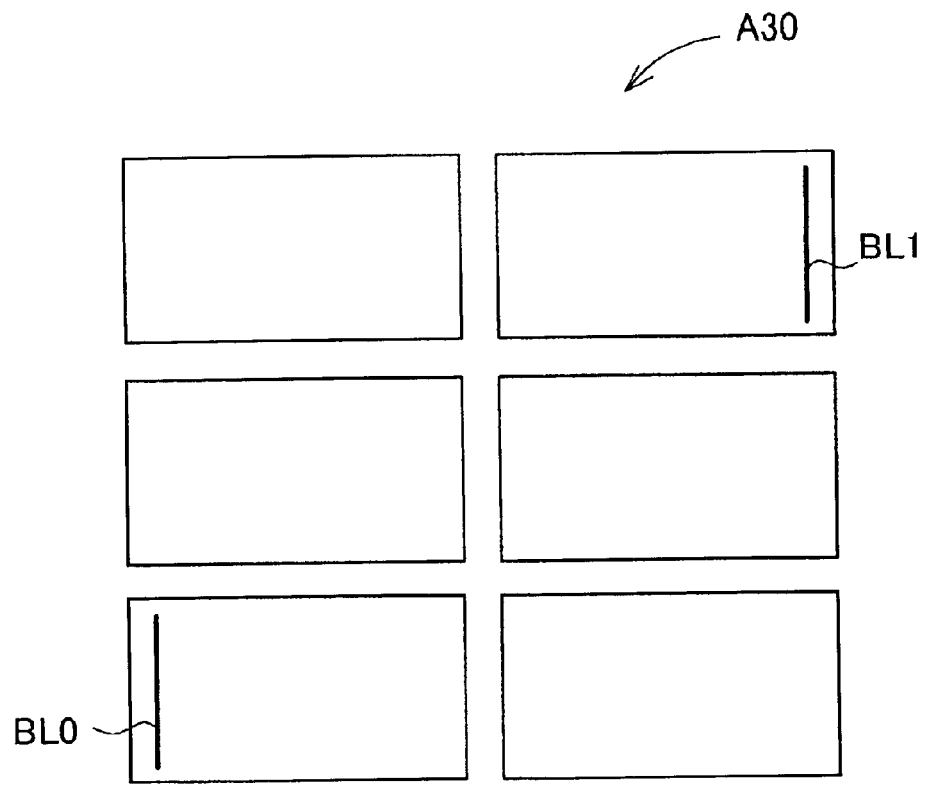
FIG. 20 is a circuit diagram showing a memory core portion of a third embodiment.
Figure 21:
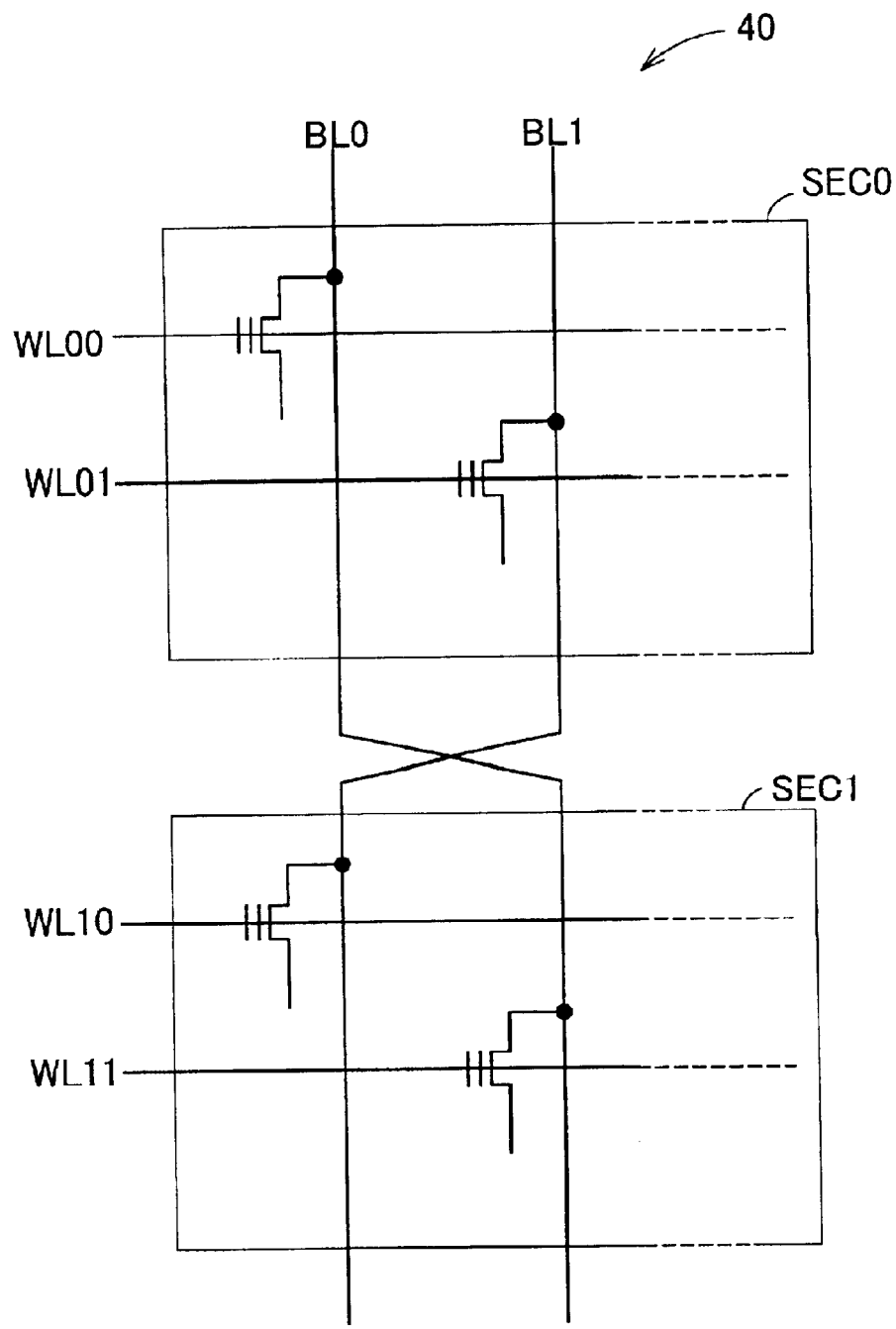
FIG. 21 is a circuit diagram showing a memory core portion of a fourth embodiment.

It is possible to form such a nonvolatile semiconductor memory device in which a predetermined number of the nonvolatile memory cells are gathered and constructed as a basic unit for accessing a nonvolatile memory cell in the form of sectors SEC0, SEC1 and the positional relationship of a pair of the local bit lines LBL00 and LBL01, LBL02 and LBL03 is inverted every sector SEC0, SEC1. Consequently, the positional relationship of the local bit lines LBL00 and LBL01, LBL02 and LBL03 is inverted every sector SEC0, SEC1 if they are formed separately in the sectors SEC0, SEC1. As a result, the parasitic capacitance formed between peripheral structures can be equalized between the local bit lines LBL00/LBL01 and LBL02/LBL03. This structure is shown in FIG. 19 as a memory core portion A20 of the second embodiment.

Although with the first embodiment, a nonvolatile semiconductor memory device having a two-stage hierarchical bit line structure composed of the local bit lines and global bit lines has been described, the present invention is not restricted to this example, but needless to say, the first to third embodiments can be applied to a nonvolatile semiconductor memory device having a single stage hierarchical bit line structure. That is, in a memory core portion A40 according to a fourth embodiment shown in FIG. 21, the bit lines BL0, BL1 are not constructed in hierarchical structure. In the sector SEC0, memory cell groups selected by the word lines WL00, WL01 are disposed at respective bit lines BL0, BL1 while in the sector SEC1, similarly, memory cell groups selected by the word lines WL10, WL11 are disposed. If word lines WL00 through WL11 are controlled so as to select a memory cell connected to any one of a pair of the bit lines BL0, BL1 in each sector, the other bit line of the bit lines BL0, BL1 can be made a load on the reference side. Further, by inverting the positional relationship of the bit lines BL0, BL1 in each sector SEC0, SEC1, the parasitic capacitance possessed by the bit lines BL0, BL1 can be matched.

According to the present invention, upon a reading operation, with a global bit line to which a selected memory cell is connected and an adjacent global bit line as a pair, loads connected to a pair of the data bus lines are ideally equalized. Further, the parasitic capacitance accompanied by a path gate intended to connect the global bit line to the data bus line is minimized and a voltage stress to a nonvolatile cell generating a reference current is excluded so as to achieve differential amplification to a stabilized reference current. Consequently, memory cell information can be defined in an initial transient response period of the reading operation and a rapid reading operation can be realized. By disposing a pair of the global bit lines adjacent each other, noise applied to one is applied to the other, so that influences on both are canceled, thereby leading to the improvement of reading reliability of memory cell information.

What is claimed is:

1. A nonvolatile semiconductor memory device comprising a plurality of memory blocks each including a plurality of nonvolatile memory cells and including a plurality of digit lines to which the plurality of nonvolatile memory cells are connected, wherein upon reading of memory cell information, the digit lines contain a first digit line connected to the plurality of nonvolatile memory cells including a selected nonvolatile memory cell which is in a first memory block of the memory blocks and is subject to the reading; and a second digit line connected to the plurality of nonvolatile memory cells including only non-selected nonvolatile memory cells which are in a second memory block and are not subject to the reading, while the memory cell information is read out with the first and second digit lines as a pair.

2. A nonvolatile semiconductor memory device as claimed in claim 1, wherein the first digit line and the second digit line adjoin each other.

3. A nonvolatile semiconductor memory device as claimed in claim 1, wherein the first digit line and the second digit line have equivalent physical parameters surrounding the first and second digit lines.

4. A nonvolatile semiconductor memory device as claimed in claim 1, wherein a positional relationship of the first digit line and the second digit line is inverted by each of the memory block.

5. A nonvolatile semiconductor memory device as claimed in claim 1, further comprising a plurality of sectors, each of the sectors including a predetermined number of the nonvolatile memory cells and serving as a basic unit for accessing the nonvolatile memory cell, wherein the first digit line is disposed in a first sector while the second digit line is disposed in a second sector.

6. A nonvolatile semiconductor memory device as claimed in claim 5, wherein the first sector and the second sector are disposed adjoining each other.

7. A nonvolatile semiconductor memory device as claimed in claim 5, wherein the first digit line and the second digit line have equivalent physical parameters surrounding the digit line.

8. A nonvolatile semiconductor memory device comprising a plurality of memory blocks each including a plurality of nonvolatile memory cells, each memory block having a plurality of local digit lines to which the plurality of nonvolatile memory cells are connected and a global digit line provided for each predetermined number of the local digit lines and to which the local digit line is selectively connected, wherein upon reading memory cell information, the global digit lines include:

a first global digit line connected to a first local digit line to which the plurality of nonvolatile memory cells including a selected nonvolatile memory cell which is in a first memory block of the memory blocks and is subjected to the reading is connected; and a second global digit line connected to a second local digital line to which the plurality of nonvolatile memory cells including only non-selected nonvolatile memory cells which are adjacent to the first global digital line and in a second memory block of the memory blocks and are not subject to the reading, while the memory cell information is read out with the first and second global digit lines as a pair.

9. A nonvolatile semiconductor memory device as claimed in claim 8, wherein the second global digit line is connected to a second local digit line to which only the non-selected nonvolatile memory cells are connected.

10. A nonvolatile semiconductor memory device as claimed in claim 9, wherein the first local digit line and the second local digit line adjoin each other.

11. A nonvolatile semiconductor memory device as claimed in claim 9, wherein the first local digit line and the second local digit line have equivalent physical parameters surrounding the first and second local digit lines.

12. A nonvolatile semiconductor memory device as claimed in claim 9, wherein
a positional relationship of the first local digit line and the second local digit line is inverted every memory block.

13. A nonvolatile semiconductor memory device as claimed in claim 9, further comprising a plurality of sectors, each of the sectors including a predetermined number of the nonvolatile memory cells and serving as a basic unit for accessing the nonvolatile memory cell, wherein
the first local digit line is disposed in a first sector while the second local digit line is disposed in a second sector.

14. A nonvolatile semiconductor memory device as claimed in claim 13, wherein the first sector and the second sector are disposed adjoining each other.

15. A nonvolatile semiconductor memory device as claimed in claim 13, wherein the first local digit line and the second local digit line have equivalent physical parameters surrounding the local digit line.

16. A nonvolatile semiconductor memory device as claimed in claim 12, wherein the positional relationship of the first global digit line and the second global digit line is inverted by each of the sector.

17. A nonvolatile semiconductor memory device as claimed in claim 13, wherein a positional relationship of the first global digit line and the second global digit line is inverted every sector.

18. A nonvolatile semiconductor memory device as claimed in claim 1, wherein a minimum unit of redundant configuration for recovery of a defect is comprised of the first and second digit lines making a pair.

19. A nonvolatile semiconductor memory device as claimed in claim 8, wherein a minimum unit of redundant configuration for recovery of a defect is comprised of the first and second global digit lines making a pair.

20. A nonvolatile semiconductor memory device comprising a plurality of memory blocks each including a plurality of nonvolatile memory cells and including a plurality of digit lines to which the plurality of nonvolatile memory cells are connected, wherein
the digit lines include a first digit line connected to the plurality of nonvolatile memory cells including a selected nonvolatile memory cell which is in a first memory block of the memory blocks and is subject to access; and
a second digit line connected to the plurality of nonvolatile memory cells including only non-selected nonvolatile memory cells which are in a second memory block of the memory blocks and are not subject to the access,
the nonvolatile semiconductor memory device further comprises a selecting portion provided for every predetermined number of the digit lines and for, upon reading memory cell information by the access, selecting both the first and second digit lines and, upon writing memory cell information by the access, selecting only the first digit line.

21. A nonvolatile semiconductor memory device as claimed in claim 20, further comprising a data line connected selectively to the digit line, wherein the selecting portion includes a switching portion for, upon reading memory cell information, connecting the digit line to the data line by a first current driving power and, upon writing memory cell information, connecting the digit line to the data line by a second current driving power which is larger than the first current driving power.

22. A nonvolatile semiconductor memory device as claimed in claim 21, further comprising a data line connected selectively to the digit line, wherein the selecting portion includes a first path leading from the digit line to the data line upon reading memory cell information and a second path leading from the data line to the digit line upon writing memory cell information.

23. A nonvolatile semiconductor memory device as claimed in claim 22, wherein the switching portion comprising the first path is comprised of a low voltage resistance element, while the switching portion comprising the second path is comprised of a high voltage resistance element.

24. A nonvolatile semiconductor memory device as claimed in claim 22, further comprising:
a first control portion for turning on/off the switching portion comprising the first path; and
a second control portion for turning on/off the switching portion comprising the second path, wherein
the first control portion is comprised of a low voltage resistance element while the second control portion is comprised of a high voltage resistance element.

25. A nonvolatile semiconductor memory device as claimed in claim 22, wherein the second path is so constructed as to include the first path.

26. A nonvolatile semiconductor memory device as claimed in claim 21, further comprising first and second switching portions for, upon reading memory cell information, connecting the first and second digit lines to respectively different the data lines and a third switching portion for, upon writing memory cell information, connecting the first digit line to the third data line.

27. A nonvolatile semiconductor memory device as claimed in claim 22, further comprising first and second switching portions for, upon reading memory cell information, connecting the first and second digit lines to respectively different the data lines and a third switching portion for, upon writing memory cell information, connecting the first digit line to the third data line.

28. A nonvolatile semiconductor memory device as claimed in claim 20, wherein
the digit lines further include a first and second global digit line which are provided for every predetermined number of the first and second digit lines and are selectively connected to the first and second digit lines, and
the selecting portion is provided for every predetermined number of the first and second global digit lines, and selects both the first and second global digit lines upon reading memory cell information and selects only the first global digit line upon writing the memory cell information.

29. A nonvolatile semiconductor memory device having a plurality of digit lines to which a plurality of nonvolatile memory cells are connected and a plurality of data lines provided for every predetermined number of the digit lines and connected selectively to a selected one of the digit lines, the nonvolatile semiconductor memory device further comprising:
a first data line to which the plurality of nonvolatile memory cells including a selected nonvolatile memory cell which is subject to the reading of memory cell information is connected through a first digit line;

a second data line to which the plurality of nonvolatile memory cells including only non-selected nonvolatile memory cells which are not subject to the reading of the memory cell information are connected through a second digit line;

a first loading portion connected to the first data line; and a second loading portion having a structure equivalent to that of the first loading portion, connected to the second data line and for supplying a reference current to a current flowing through the first data line based on the memory cell information, wherein the memory cell information is read out with the first and second data lines as a pair.

30. A nonvolatile semiconductor memory device as claimed in claim 29, wherein the first and second loading portions have a load equivalent to a load existing on a path leading from the nonvolatile memory cell to the first and second loading portions.

31. A nonvolatile semiconductor memory device as claimed in claim 29, wherein the first and second loading portions have first and second reference cells equivalent to the nonvolatile memory cell.

32. A nonvolatile semiconductor memory device as claimed in claim 29, further comprising a regulating portion containing a third reference cell equivalent to the nonvolatile memory cell, for generating a reference current with respect to a current based on the memory cell information and outputting a regulation voltage corresponding to the reference current, wherein the first and second loading portions have first and second load portions in which a current value is controlled by the regulation voltage.

33. A nonvolatile semiconductor memory device as claimed in claim 31, wherein the first and second reference cells are disposed in a region different from an arrangement region of the nonvolatile memory cell in which the memory cell information is stored.

34. A nonvolatile semiconductor memory device as claimed in claim 31, further comprising first and second selecting switches for connecting the first and second reference cells to a reference potential, wherein any one of the first selecting switch and the second selecting switch is selectively turned on.

35. A nonvolatile semiconductor memory device as claimed in claim 32, wherein the third reference cell is disposed in a region different from an arrangement region of the nonvolatile memory cell in which the memory cell information is stored.

36. A nonvolatile semiconductor memory device as claimed in claim 32, further comprising first and second selecting switches for connecting the first and second load portions to a reference potential, wherein any one of the first selecting switch and the second selecting switch is selectively turned on.

37. A nonvolatile semiconductor memory device as claimed in claim 32, wherein the regulating portion includes a reference current generating portion containing the third reference cell, and a regulation voltage generating portion containing a third load portion equivalent to the first and second load portions.

38. A nonvolatile semiconductor memory device as claimed in claim 37, wherein the regulating portion includes a current mirror portion for mirroring a reference current generated by the reference current generating portion to the regulation voltage generating portion, and a feedback portion for controlling the third load portion so as to supply the mirrored reference current to the regulation voltage generating portion.

39. A nonvolatile semiconductor memory device as claimed in claim 38, wherein the feedback portion outputs the regulation voltage.

40. A nonvolatile semiconductor memory device as claimed in claim 29, wherein the digit line is a global digit line which is provided in every plural local digit lines to which the plurality of nonvolatile memory cells are connected and to which the local digit lines are selectively connected.

41. A nonvolatile semiconductor memory device having a plurality of digit lines to which a plurality of nonvolatile memory cells are connected and a data line provided for every predetermined number of the digit lines and connected selectively to a selected one of the digit lines, the nonvolatile semiconductor memory device further comprising:

a first data line to which the selected nonvolatile memory cell which is subject to reading of memory cell information is connected through the digit line and through which a current based on the memory cell information flows;

a second data line through which a reference current flows; and a current comparing portion to which the first and second data lines are connected and which compares a current based on the memory cell information with the reference current, wherein the current comparing portion includes a current load portion having a current mirror structure and a connection changing portion for holding a predetermined connecting relation to the first and second data lines to the current load portion by changing a connection between the data lines and the current load portion.

42. A nonvolatile semiconductor memory device as claimed in claim 41, wherein the connection changing portion is so controlled that the second data line is connected to a reference side in the current mirror structure of the current load portion.

43. A nonvolatile semiconductor memory device as claimed in claim 41, wherein the connection changing portion includes a voltage dividing portion for restricting a voltage applied to the current load portion side irrespective of a voltage of the first and second data lines.

44. A nonvolatile semiconductor memory device having a plurality of digit lines to which a plurality of nonvolatile memory cells are connected and a data line provided for every predetermined number of the digit lines and connected selectively to a selected one of the digit lines, the nonvolatile semiconductor memory device further comprising:

a first data line to which the selected nonvolatile memory cell which is subject to reading of memory cell information is connected through the digit line and through which a current based on the memory cell information flows;

a second data line through which a reference current flows; and a current comparing portion to which the first and second data lines are connected and which compares a current based on the memory cell information with the reference current, wherein the current comparing portion includes a current load portion for supplying a current equivalent to the reference current to the first and second data lines.

45. A nonvolatile semiconductor memory device as claimed in claim 44, further comprising a voltage dividing portion for restricting a voltage applied to the current load portion side irrespective of a voltage of the first and second data lines, the voltage dividing portion being provided between the first and second data lines and the current load portion.

46. A nonvolatile semiconductor memory device as claimed in claim 41, further comprising a bias portion for restricting a voltage applied to the first and second data lines side irrespective of a voltage outputted from the current load portion.

47. A nonvolatile semiconductor memory device as claimed in claim 41, wherein the digit line is a global digit line which is provided in every plural local digit lines to which the plurality of nonvolatile memory cells are connected and to which the local digit lines are selectively connected.

* * * * *